(12) United States Patent
Sanders et al.

(10) Patent No.: US 8,461,752 B2
(45) Date of Patent: *Jun. 11, 2013

(54) WHITE LIGHT LAMP USING SEMICONDUCTOR LIGHT EMITTER(S) AND REMOTELY DEPLOYED PHOSPHOR(S)

(75) Inventors: Chad N. Sanders, Ashburn, VA (US); J. Michael Phipps, Springfield, VA (US); Jack C. Rains, Jr., Herndon, VA (US); David P. Ramer, Reston, VA (US)

(73) Assignee: ABL IP Holding LLC, Conyers, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/051,596

(22) Filed: Mar. 18, 2011

(65) Prior Publication Data

US 2011/0193473 A1    Aug. 11, 2011

(51) Int. Cl.
H05B 33/02    (2006.01)

(52) U.S. Cl.
USPC .......................................................... 313/483

(58) Field of Classification Search
USPC ................................................. 313/483–485
See application file for complete search history.

(56) References Cited

U.S. PATENT DOCUMENTS

| | | |
|---|---|---|
| 1,930,879 A | 10/1933 | Linderoth et al. |
| 1,956,133 A | 4/1934 | Rosenblad |
| 2,061,742 A | 11/1936 | Swart |
| 2,142,679 A | 1/1939 | Werner |
| 2,856,161 A | 10/1958 | Flynn |
| 3,376,403 A | 4/1968 | Driga |
| 3,486,489 A | 12/1969 | Huggins |
| 4,543,622 A | 9/1985 | Menke et al. |
| 4,729,076 A | 3/1988 | Masami et al. |
| 5,785,418 A | 7/1998 | Hochstein |
| 5,806,965 A | 9/1998 | Deese |
| 5,857,767 A | 1/1999 | Hochstein |
| 6,045,240 A | 4/2000 | Hochstein |
| 6,247,829 B1 | 6/2001 | Lee |
| 6,311,764 B1 | 11/2001 | Schulz et al. |
| 6,431,728 B1 | 8/2002 | Fredericks et al. |
| 6,450,661 B1 | 9/2002 | Okumura |
| 6,499,860 B2 | 12/2002 | Begemann |
| 6,517,217 B1 | 2/2003 | Liao |
| 6,578,986 B2 | 6/2003 | Swaris et al. |
| 6,580,228 B1 | 6/2003 | Chen et al. |
| 6,598,996 B1 | 7/2003 | Lodhie |
| 6,621,222 B1 | 9/2003 | Hong |
| 6,682,211 B2 | 1/2004 | English et al. |
| 6,709,132 B2 | 3/2004 | Ishibashi |

(Continued)

OTHER PUBLICATIONS

Dr. S. Sunderrajan, President, "Delivering Tunable Color Quality with Compromise," Strategies in Light, The Leading Events for the Global LED Lighting Industry, NNCrystal US Corporation, Feb. 2011.

(Continued)

*Primary Examiner* — Anh Mai
*Assistant Examiner* — Hana Featherly
(74) *Attorney, Agent, or Firm* — RatnerPrestia

(57) ABSTRACT

The present subject matter relates to lamps for general lighting applications. More specifically, white light lamps described herein use semiconductor source to pump remotely deployed phosphor to produce light of desired characteristics. The lamps conform to form factors and/or use lamp base connectors of widely accepted lamp designs, such as those of common incandescent lamps and/or compact fluorescent lamps.

29 Claims, 18 Drawing Sheets

U.S. PATENT DOCUMENTS

| | | | |
|---|---|---|---|
| 6,712,486 B1 | 3/2004 | Popovich et al. | |
| 6,787,999 B2 | 9/2004 | Stimac et al. | |
| 6,799,864 B2 | 10/2004 | Bohler et al. | |
| 6,864,513 B2 | 3/2005 | Lin et al. | |
| 6,869,545 B2 | 3/2005 | Peng et al. | |
| 6,872,249 B2 | 3/2005 | Peng et al. | |
| 6,880,956 B2 | 4/2005 | Zhang | |
| 6,948,829 B2 | 9/2005 | Verdes et al. | |
| 6,969,843 B1 | 11/2005 | Beach et al. | |
| 6,974,234 B2 | 12/2005 | Galli | |
| 6,991,351 B1 | 1/2006 | Petrick | |
| 7,058,103 B2* | 6/2006 | Ishida et al. | 372/43.01 |
| 7,086,767 B2 | 8/2006 | Sidwell et al. | |
| 7,105,051 B2 | 9/2006 | Peng et al. | |
| 7,121,687 B2 | 10/2006 | Sidwell et al. | |
| 7,148,632 B2 | 12/2006 | Berman et al. | |
| 7,153,703 B2 | 12/2006 | Peng et al. | |
| 7,157,745 B2 | 1/2007 | Blonder et al. | |
| 7,160,525 B1 | 1/2007 | Peng et al. | |
| 7,207,695 B2 | 4/2007 | Coushaine et al. | |
| 7,210,832 B2 | 5/2007 | Huang | |
| 7,226,189 B2 | 6/2007 | Lee et al. | |
| 7,273,904 B2 | 9/2007 | Peng et al. | |
| 7,300,187 B2 | 11/2007 | Huang et al. | |
| 7,314,291 B2 | 1/2008 | Tain et al. | |
| 7,338,186 B1 | 3/2008 | Wu et al. | |
| 7,345,320 B2 | 3/2008 | Dahm | |
| 7,396,142 B2 | 7/2008 | Laizure, Jr. et al. | |
| 7,488,093 B1 | 2/2009 | Huang et al. | |
| 7,531,149 B2 | 5/2009 | Peng et al. | |
| 7,543,960 B2 | 6/2009 | Chang et al. | |
| 7,547,124 B2 | 6/2009 | Chang et al. | |
| 7,581,856 B2 | 9/2009 | Kang et al. | |
| 7,588,351 B2 | 9/2009 | Meyer | |
| 7,604,380 B2 | 10/2009 | Burton et al. | |
| 7,641,361 B2 | 1/2010 | Wedell et al. | |
| 7,708,452 B2 | 5/2010 | Maxik et al. | |
| 7,740,380 B2 | 6/2010 | Thrailkill | |
| 7,748,876 B2 | 7/2010 | Zhang et al. | |
| 7,753,560 B2 | 7/2010 | Xu et al. | |
| 7,755,901 B2 | 7/2010 | Shen | |
| 7,768,192 B2* | 8/2010 | Van De Ven et al. | 313/503 |
| 7,824,075 B2 | 11/2010 | Maxik | |
| 7,845,825 B2 | 12/2010 | Ramer et al. | |
| 7,862,210 B2 | 1/2011 | Zhang et al. | |
| 7,880,389 B2 | 2/2011 | Imai et al. | |
| 2002/0012246 A1 | 1/2002 | Rincover et al. | |
| 2002/0027775 A1 | 3/2002 | Gibboney, Jr. | |
| 2002/0149025 A1 | 10/2002 | Andriedden et al. | |
| 2004/0135504 A1 | 7/2004 | Tamaki et al. | |
| 2004/0213016 A1 | 10/2004 | Rice | |
| 2004/0251011 A1 | 12/2004 | Kudo | |
| 2005/0068776 A1 | 3/2005 | Ge | |
| 2005/0092469 A1 | 5/2005 | Huang | |
| 2005/0117361 A1 | 6/2005 | Takeda et al. | |
| 2006/0092639 A1 | 5/2006 | Livesay et al. | |
| 2006/0198147 A1* | 9/2006 | Ge | 362/294 |
| 2007/0241661 A1* | 10/2007 | Yin | 313/502 |
| 2007/0267976 A1* | 11/2007 | Bohler et al. | 315/112 |
| 2007/0285926 A1 | 12/2007 | Maxik | |
| 2008/0093963 A1* | 4/2008 | Marien et al. | 313/113 |
| 2008/0290814 A1* | 11/2008 | Leong et al. | 315/294 |
| 2009/0002995 A1 | 1/2009 | Lee et al. | |
| 2009/0073697 A1 | 3/2009 | Peck et al. | |
| 2009/0097241 A1 | 4/2009 | Xu et al. | |
| 2009/0251884 A1 | 10/2009 | Rains | |
| 2009/0268461 A1 | 10/2009 | Deak et al. | |
| 2009/0294780 A1 | 12/2009 | Chon et al. | |
| 2009/0295266 A1 | 12/2009 | Ramer et al. | |
| 2009/0296368 A1 | 12/2009 | Ramer | |
| 2009/0315448 A1 | 12/2009 | Kuze et al. | |
| 2010/0027258 A1 | 2/2010 | Maxik et al. | |
| 2010/0073924 A1 | 3/2010 | Deng | |
| 2010/0103678 A1 | 4/2010 | Van Den Ven et al. | |
| 2010/0133578 A1 | 6/2010 | Pickard et al. | |
| 2010/0172122 A1 | 7/2010 | Ramer et al. | |
| 2010/0187961 A1 | 7/2010 | Scott | |
| 2010/0207502 A1 | 8/2010 | Cao et al. | |
| 2010/0213808 A1 | 8/2010 | Shi | |
| 2010/0219735 A1 | 9/2010 | Sakai et al. | |
| 2010/0258828 A1 | 10/2010 | Ramer et al. | |
| 2010/0277059 A1 | 11/2010 | Rains, Jr. et al. | |
| 2010/0277067 A1 | 11/2010 | Maxik et al. | |
| 2010/0277069 A1 | 11/2010 | Janik et al. | |
| 2010/0277907 A1 | 11/2010 | Phipps et al. | |
| 2010/0301729 A1 | 12/2010 | Simon et al. | |
| 2010/0314985 A1 | 12/2010 | Premysler | |
| 2010/0315252 A1 | 12/2010 | Desphande et al. | |
| 2011/0019409 A1 | 1/2011 | Wronski | |
| 2011/0045614 A1 | 2/2011 | Helbing et al. | |
| 2011/0051423 A1* | 3/2011 | Hand et al. | 362/294 |
| 2011/0095686 A1 | 4/2011 | Falicoff et al. | |
| 2011/0140593 A1 | 6/2011 | Negley et al. | |
| 2011/0175520 A1 | 7/2011 | Ramer et al. | |
| 2011/0176291 A1 | 7/2011 | Sanders et al. | |
| 2011/0176316 A1 | 7/2011 | Phipps et al. | |
| 2011/0193473 A1 | 8/2011 | Sanders et al. | |
| 2011/0215696 A1 | 9/2011 | Tong et al. | |
| 2011/0278633 A1 | 11/2011 | Clifford | |

OTHER PUBLICATIONS

NNCrystal Poster Displayed at LightFair 2010, May 10-14, 2010.
NNCrystal Corporation Handout at LightFair May 10-14, 2010.
Truewhite Light Technology Cree True White Light, 2011.
M. Lamonica, "Cree raises stakes in LED bulb race," CNET News, Jan. 27, 2011.
M. Lamonica, "Sylvania takes on 60-watt bulb with LED light" CNET News, May 13, 2010.
M. Lamonica, "GE makes LED replacement for 40-watt bulb," CNET News, Apr. 8, 2010.
C. Lombardi, "Philips offers LED replacement for 60-watt bulb," CNET News, May 12, 2010.
M. Lamonica, "LEDs keep coming: 60-watt stand-in priced at $30," CNET News, Dec. 13, 2010.
"Lighting Science Group Pursues Prestigious L Prize with Revolutionary New LED Bulb," Mar. 8, 2011.
US Office Action issued in U.S. Appl. No. 13/051,628, dated Jul. 25, 2011.
Pradhan, Narayan, et al., "An Alternative of CdSe Nanocrystal Emitters: Pure and Tunable Impurity Emissions in ZnSe Nonocrystals", Nov. 24, 2005, 127, pp. 17586-17587, J. A, Chem, Soc. Communications, web publication.
"Energy Star Program Requirements for Solid State Lighting Luminaires Eligibility Criteria—Version 1.0", Manual, Sep. 12, 2007.
Yin, Yadong and A. Paul Alivisatos, "Colloidal nanocrystal sythesis and the organic-inorganic interface", Insight Review, Sep. 25, 2005, pp. 664-670, Nature vol. 437.
"Final Report: Highly Bright, Heavy Metal-Free, and Stable Doped Semiconductor Nanophosphors for Economical Solid State Lighting Alternatives", Report, Nov. 12, 2009, pp. 1-3, National Center for Environmental Research, web publication.
"Solid-State Lighting: Development of White LEDs Using Nanophosphor-InP Blends", Report, Oct. 26, 2009, p. 1, U.S. Department of Energy—Energy Efficiency and Renewable Energy, web publication.
"Solid-State Lighting: Improved Light Extraction Efficiencies of White pc-LEDs for SSL by Using Non-Toxic, Non-Scattering, Bright, and Stable Doped ZnSe Quantum Dot Nanophosphors (Phase I)", Report, Oct. 26, 2009,pp. 1-2, U.S. Department of Energy—Energy Efficiency and Renewable Energy, web publication.
"Chemistry—All in the Dope", Editor's Choice, Dec. 9, 2005, Science, vol. 310, p. 1, AAAS, web publication.
"D-dots: Heavy Metal Free Doped Semiconductor Nanocrystals", Technical Specifications, etc. Dec. 1, 2009, pp. 1-2, NN-LABS, LLC (Nanomaterials & Nanofabrication Laboratories), CdSe/ZnS Semiconductor Nanocrystals, web publication.
International Search Report and the Written Opinion of the International Searching Authority issued in International Patent Application No. PCT/US12/27862 dated Jul. 13, 2012.
International Search Report and the Written Opinion of the International Searching Authority issued in International Patent Application No. PCT/US12/27869 dated Jul. 13, 2012.

International Search Report and the Written Opinion of the International Searching Authority issued in International Patent Application No. PCT/US12/27856 dated Jul. 13, 2012.

United States Office Action issued in U.S. Appl. No. 13/051,628 dated Sep. 26, 2011.

United States Office Action issued in U.S. Appl. No. 13/051,628 dated Jul. 17, 2012.

United States Notice of Allowance issued in U.S. Appl. No. 13/051,628 dated Aug. 24, 2012.

United States Office Action issued in U.S. Appl. No. 13/051,662 dated Apr. 13, 2012.

United States Office Action issued in U.S. Appl. No. 13/051,628 dated Mar. 1, 2012.

United States Office Action issued in U.S. Appl. No. 13/051,662 dated Sep. 27, 2012.

Final Office Action issued in U.S. Appl. No. 13/603,938, dated Apr. 4, 2013.

Final Office Action issued in U.S. Appl. No. 13/051,662, dated Mar. 14, 2013.

\* cited by examiner

WHITE LIGHT LAMP USING SEMICONDUCTOR LIGHT EMITTER(S) AND REMOTELY DEPLOYED PHOSPHOR(S)

TECHNICAL FIELD

The present subject matter relates to lamps for general lighting applications that utilize solid state emitter(s) to pump one or more phosphors, to produce light of desired characteristics, yet can conform to form factors and/or use lamp base connectors of widely accepted lamp designs, such as those of common incandescent lamps and/or compact fluorescent lamps.

BACKGROUND

It has been recognized that incandescent lamps are a relatively inefficient light source. However, after more than a century of development and usage, they are cheap. Also, the public is quite familiar with the form factors and light output characteristics of such lamps. Fluorescent lamps have long been a more efficient alternative to incandescent lamps. For many years, fluorescent lamps were most commonly used in commercial settings. However, recently, compact fluorescent lamps have been developed as replacements for incandescent lamps. While more efficient than incandescent lamps, compact fluorescent lamps also have some drawbacks. For example, compact fluorescent lamps utilize mercury vapor and represent an environmental hazard if broken or at time of disposal. Cheaper versions of compact fluorescent lamps also do not provide as desirable a color characteristic of light output as traditional incandescent lamps and often differ extensively from traditional lamp form factors.

As costs of energy increase along with concerns about global warming due to consumption of fossil fuels to generate energy, there is an ever increasing need for more efficient lamp technologies for general lighting applications. These demands, coupled with rapid improvements in semiconductors and related manufacturing technologies, are driving a trend in the lighting industry toward the use of light emitting diodes (LEDs) or other solid state light emitting sources to produce white light for general lighting applications, as replacements for common incandescent lamps and/or compact fluorescent lamps and other older less efficient light sources.

A number of products and proposals have used or suggested use of remotely deployed phosphors in light fixtures and/or in lamps, which utilize solid state light sources. However, there is still room for improvement, for example, in terms one or more of light quality, efficiency, and/or ease of manufacture or cost. Thus, there is a need for lamps for general lighting applications that utilize solid state light emitting sources to pump remotely deployed semiconductor phosphor, to effectively produce and distribute light of desired characteristics. The lamps should utilize energy efficient solid state light emitters, and conform to form factors and/or use lamp base connectors of widely accepted lamp designs, such as those of common incandescent lamps and/or compact fluorescent lamps.

SUMMARY

The teachings herein provide further improvements over existing lighting technologies for providing energy efficient, substantially white light from a lamp utilizing solid state light emitters to pump remotely deployed phosphor. The light emissions through the bulb of the lamp that utilizes solid state light emitters approximate emissions from an incandescent lamp that uses a filament.

For example, a lamp is provided and includes solid state light emitters, a bulb and a pedestal extending into an interior of the bulb supporting the solid state light emitters. At least some of the solid state light emitters are supported on the pedestal in an orientation where principal directions of light emissions from respective emitters are radial outward from the pedestal through the bulb in different radial directions. At least one of the solid state emitters is supported on an end of the pedestal in such an orientation so that a principal direction of emission of light from the at least one solid state light emitter is substantially the same as or parallel with a longitudinal axis of the lamp. A phosphor is remotely deployed in the lamp with respect to the solid state light emitters. The phosphor is of a type for converting at least some portion of light from the solid state light emitters from a first spectral characteristic to a second spectral characteristic, to produce a white light output of the lamp from the bulb.

In yet another example, a lamp includes a solid state light emitter, a bulb and a pedestal extending into an interior of the bulb, which supports the solid state light emitter. The solid state light emitter is supported on the pedestal in an orientation such that the principal direction of light emissions from the emitter is outward from the pedestal through the bulb. A phosphor is remotely deployed in the lamp with respect to the solid state light emitter. The phosphor is of a type for converting at least some portion of light from the solid state light emitter from a first spectral characteristic to a second spectral characteristic, to produce an output of the lamp from the bulb that is at least substantially white.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various examples of solid state lamps disclosed herein may be used in common lighting fixtures, floor lamps and table lamps, or the like, e.g. as replacements for incandescent or compact fluorescent lamps. Reference now is made in detail to the examples illustrated in the accompanying drawings and discussed below.

Figure 1A:
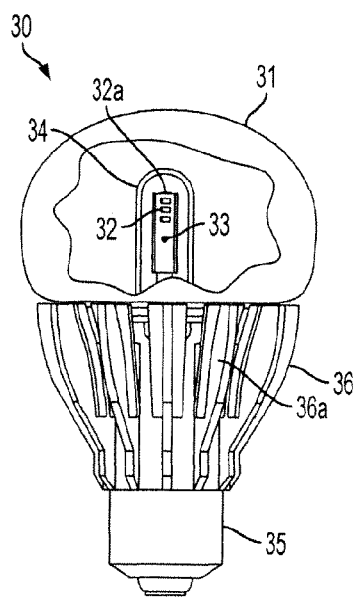
FIGS. 1A and 1B are side views of two somewhat similar examples of lamp (differing as to heat sink designs), for lighting applications, which use solid state light emitters to produce white light.
Figure 1B:
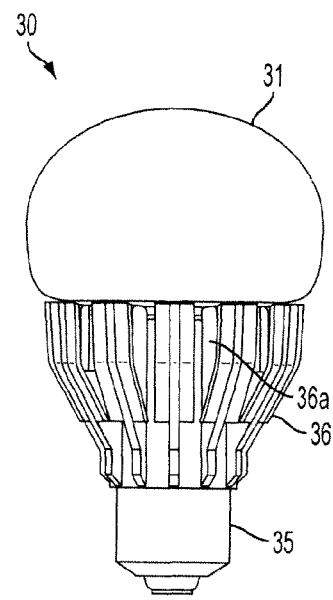

FIG. 1A illustrates an example of a solid state lamp 30. The exemplary lamp 30 may be utilized in a variety of lighting applications analogous to applications for common incandescent lamps and/or compact fluorescent lamps. The lamp 30 includes solid state light emitters 32 for producing lamp output light of a desired characteristic, from the emitter outputs and/or from luminescent phosphor emissions driven by the emitter outputs as discussed more fully below. The solid state emitters as well as the other components within the bulb 31 are visible through the cut-out window view of FIG. 1A. FIG. 1B is otherwise generally similar to FIG. 1A, minus the cut-out window, except that FIG. 1B also shows a somewhat different implementation of the heat radiation fin configuration of the heat sink.

At a high level, a lamp 30, includes solid state light emitters 32, a bulb 31 and a pedestal 33. The pedestal 33 extends into an interior of the bulb 31 and supports the solid state light emitters 32. The orientations of the solid state light emitters 32 produce emissions through the bulb 31 that approximate light source emissions from a filament of an incandescent lamp. In the examples, an inner optical processing member 34, of a material that is at least partially light transmissive, is positioned radially and longitudinally around the solid state light emitters 32 supported on the pedestal and between an inner surface of the bulb 31 and the solid state light emitters 32. The bulb and/or the inner member may be either transparent or diffusely transmissive.

The lamp 30 also includes a heat sink 36 (FIG. 1A) 36' (FIG. 1B). In these examples, the heat sinks are similar, but have somewhat different fin/flair arrangements. In either case, the heat sink has a modular-coupling for attachment of one of a number of different lighting industry standard lamp bases 35. The heat sink also has a second modular-coupling for attachment of one of a number of different types of bulbs 31. For examples that include the inner optical processing member 34, the heat sink also has a third modular-coupling for attachment of one of a number of different types of inner optical processing members 34. The base, sink and bulb also enclose circuitry to receive electricity from the lamp base 35, for driving the solid state emitters 32 of the source to emit the light.

The modular couplings facilitate use of certain common components that form a light engine together with different bulbs, bases and/or inner optical processing members for different lamp configurations. The common components forming the engine may include the pedestal, the emitters and the heat sink.

In the examples, the pedestal 33 extends from the heat sink 36 or 36' along the longitudinal axis of the light engine/lamp into a region to be surrounded by the bulb 31 when attached to the heat sink member at the first modular-coupling. The pedestal 33 provides heat conductivity to and is supported by the heat sink 36 or 36'.

In FIG. 1A, the fins 36a have an outward curved profile at their outer edge. The heat sink 36 also includes flares on the fins. In the example of FIG. 1A, the flares are located between the proximal and distal ends of the fins 36a, but the flares are curved inward (as opposed to the outer curve at the perimeter of the fins). In FIG. 1B, the fins 36a' have an angled outer profile at their outer edge. In the example of FIG. 1B, the flares are located at the distal ends of the fins, and the flares are angled to follow the angled outer contour of the fins 36a'. The length of the fins 36a/36a' longitudinally extend from the bulb 31 down to the base 35.

The solid state lamps in the examples produce light that is at least substantially white. In some examples, the solid state emitters produce light that is at least substantially white (FIG. 3A). The white light from the emitters may form the lamp output. In other examples, the emitters produce white light at a first color temperature (FIG. 3B), and phosphor(s) in the lamp converts some of that light so that the lamp output is at least substantially white but at a second color temperature. In these various examples, light is at least substantially white if human observers would typically perceive the light in question as white light.

It is contemplated that the lamp 30 may have a light output formed by only optical processing of the white light emitted by the solid state emitters 32. Hence, the white light output of the lamp 30 would be at least substantially white, in this case as white as the emitters are configured to produce; and that light would be at a particular color temperature. Producing lamps of different color temperatures, using this approach would entail use of different white solid state emitters 32.

Another approach uses the emitters 32 that emit white light at the first color temperature in combination with a remotely deployed material bearing one or more phosphors. Semiconductor nanophosphors, doped semiconductor nanophosphors, as well as rare earth and other conventional phosphors, may be used alone or in various combinations to produce desired color temperatures and/or other desirable characteristics of a white light output. In this type arrangement, the phosphor or phosphors convert at least some portion of the white light (at a first color temperature) from the solid state light emitters from a first spectral characteristic to light of second spectral characteristic, which together with the rest of the light from the emitters produce the white light output from the bulb at a second color temperature. Thus, the phosphor(s) is of a type for converting at least some portion of light from the solid state light emitters from a first spectral characteristic to a second spectral characteristic, to produce a white light output of the lamp from the bulb.

In other examples the solid state light emitters 32 could be of any type rated to emit narrower band energy and remote phosphor luminescence converts that energy so as to produce a white light output of the lamp. In the more specific examples using this type of phosphor conversion, the light emitters 32 are devices rated to emit energy of any of the wavelengths from the blue/green region around 460 nm down into the UV range below 380 nm. In some examples, the solid state light emitters 32 are rated for blue light emission, such as at or about 450 nm. In other examples, the solid state light emitters 32 are near UV LEDs rated for emission somewhere in the below 420 nm, such as at or about 405 nm. In these examples, the phosphor bearing material may use a combinations of semiconductor nanophosphors, a combination of one or more nanophosphor with at least one rare earth phosphors or a combination in which one or more of the phosphors is a doped semiconductor nanophosphor. Each phosphor or nanophosphor is of a type for converting at least some portion of the wavelength range from the solid state emitters to a different range of wavelengths. The combined emissions of the pumped phosphors alone or in combination with some portion of remaining light from the emitters results in a light output that is at least substantially white, is at a desired color temperature and may exhibit other desired white light characteristics.

In several examples offering particularly high spectral white light quality, the substantially white light corresponds to a point on the black body radiation spectrum. In such cases, the visible light output of the lamp deviates no more than ±50% from a black body radiation spectrum for the rated color temperature for the device, over at least 210 nm of the visible light spectrum. Also, the visible light output of the device has an average absolute value of deviation of no more than 15% from the black body radiation spectrum for the rated color temperature for the device, over at least the 210 nm of the visible light spectrum.

Whether using white light emitters (e.g. FIG. 3A) or emitters of energy of wavelengths from the blue/green region around 460 nm down into the UV range below 380 nm (e.g. FIG. 3B), the implementations using phosphors can use different phosphor combinations/mixtures to produce lamps with white light output at different color temperatures and/or of different spectral quality.

Figure 2:
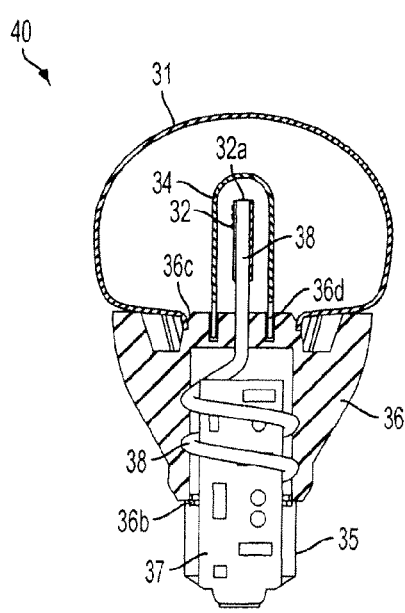
FIG. 2 is a cross-sectional view of an example of a lamp, for lighting applications, which uses solid state light emitters to produce white light.
Figure 7A:
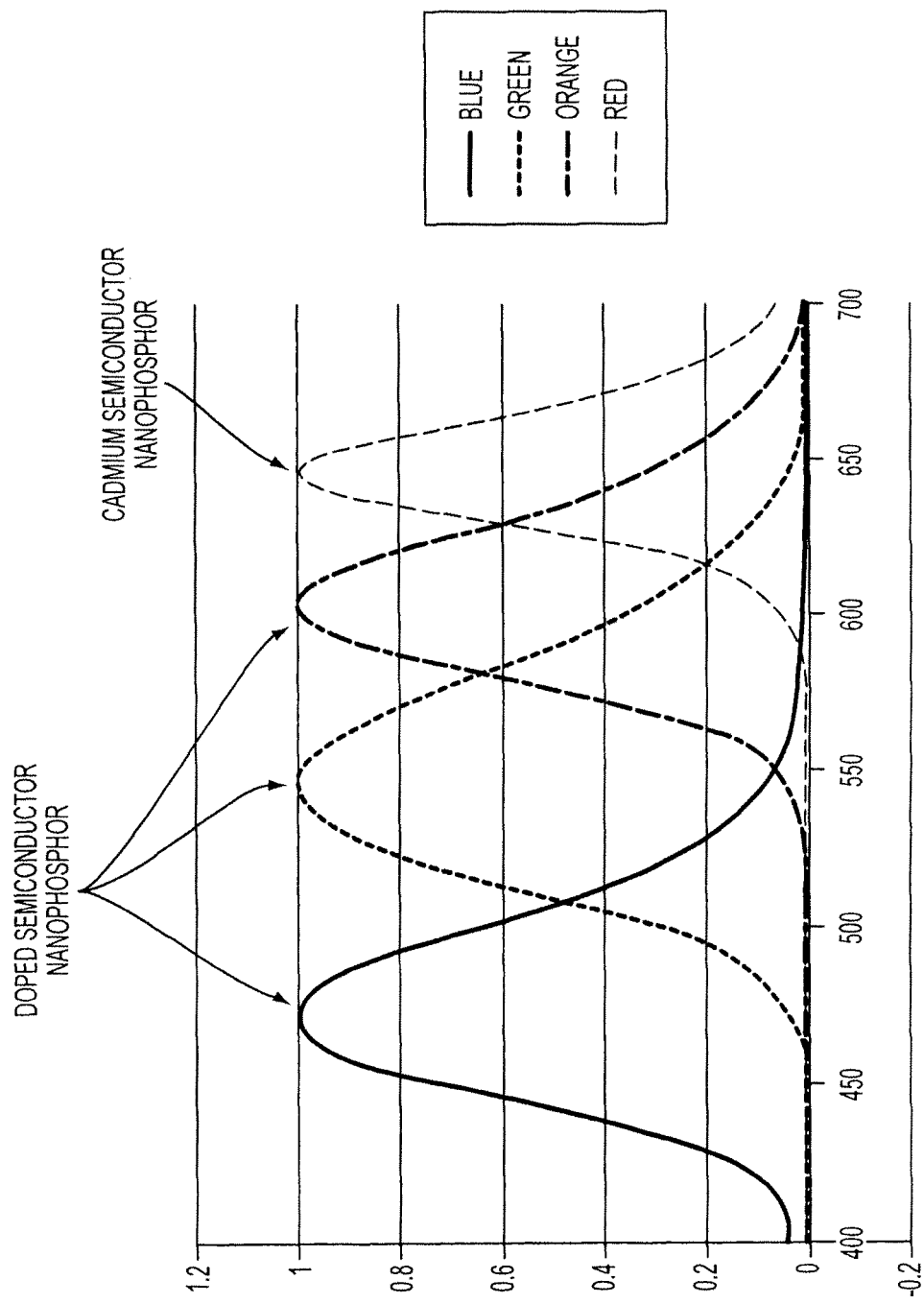
FIG. 7A is a radiation spectral graph, showing the different emission of four phosphors used in several of the examples.
Figures 1, 7B:
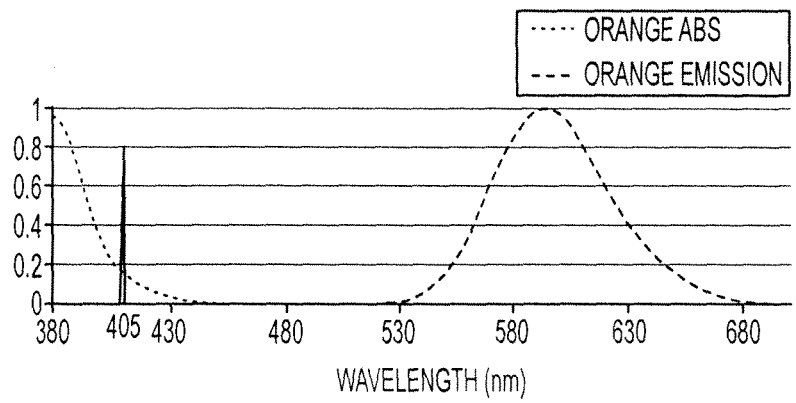
FIG. 7B is a graph of absorption and emission spectra of a number of doped type semiconductor nanophosphors.
Figures 2, 7B:
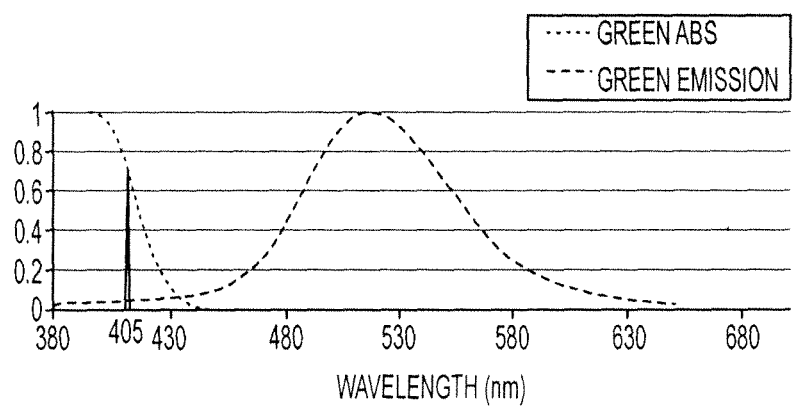
Figures 3, 7B:
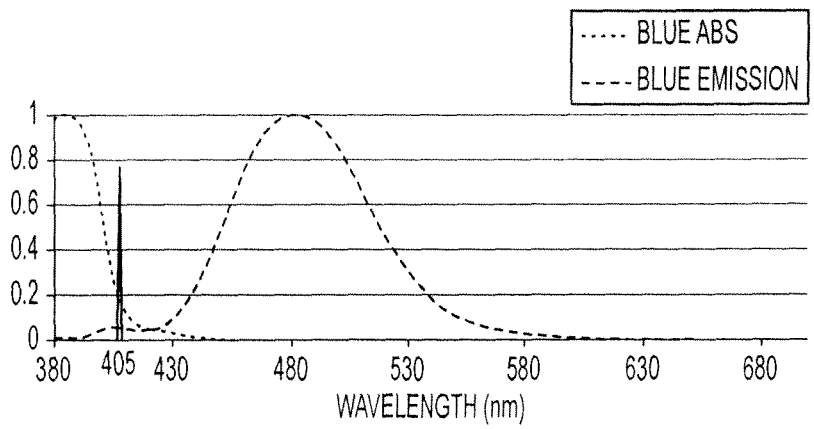

Hence, the lamp structures of FIGS. 1A-2 may be used with a number of different types of emitters alone or in combination with various phosphor materials. In initial examples, the solid state emitters are white light emitters. If phosphors are provided in such implementation, the luminescence of the phosphors changes the color temperature and possibly other characteristics of the white light output of the lamp. Later examples use solid state emitters to emit a predominant wavelength within the excitation range of the phosphor(s) and the pumped phosphor(s) produce the desired white light output.

The solid state light emitters 32 are semiconductor based structures for emitting, in some examples for emitting substantially white light and in other examples for emitting light of color in a range to pump phosphors. In the example, the light emitters 32 comprise light emitting diode (LED) devices, although other semiconductor devices might be used.

As discussed herein, applicable solid state light emitters essentially include any of a wide range light emitting or generating devices formed from organic or inorganic semiconductor materials. Examples of solid state light emitters include semiconductor laser devices and the like. Many common examples of solid state emitters, however, are classified as types of "light emitting diodes" or "LEDs." This exemplary class of solid state light emitters encompasses any and all types of semiconductor diode devices that are capable of receiving an electrical signal and producing a responsive output of electromagnetic energy. Thus, the term "LED" should be understood to include light emitting diodes of all types, light emitting polymers, organic diodes, and the like. LEDs may be individually packaged, as in the illustrated examples. Of course, LED based devices may be used that include a plurality of LEDs within one package, for example, multi-die LEDs that contain separately controllable red (R), green (G) and blue (B) LEDs within one package. Those skilled in the art will recognize that "LED" terminology does not restrict the source to any particular type of package for the LED type source. Such terms encompass LED devices that may be packaged or non-packaged, chip on board LEDs, surface mount LEDs, and any other configuration of the semiconductor diode device that emits light. Solid state lighting elements may include one or more phosphors and/or nano-phosphors, which are integrated into elements of the package to convert at least some radiant energy to a different more desirable wavelength or range of wavelengths.

FIG. 3A illustrates an example of a visible white light type LED device, in cross section, by way of a first example 11a of a solid state device of the type discussed herein. The structural configuration of the solid state device 11a shown in FIG. 3A is presented here by way of example only. Those skilled in the art will appreciate that the device may utilize any device structure.

In the example of FIG. 3A, the solid state device 11a includes a semiconductor chip, comprising two or more semiconductor layers 13a, 15a forming the actual LED. In this first example, the semiconductor layers 13a, 15a of the chip are mounted on an internal reflective cup 17a, formed as an extension of a first electrode, e.g. the cathode 19a. The cathode 19a and an anode 21a provide electrical connections to layers of the semiconductor chip within the packaging for the device 11a. When appropriate current is supplied through the cathode 19a and the anode 21a to the LED chip layers 15a and 13a, the chip emits electromagnetic energy. In the example, an epoxy dome 23a (or similar transmissive part) of the enclosure allows for emission of the electromagnetic energy from the device 11a in the desired direction.

The chip structure shown in FIG. 3A is given by way of a simple example, only. Those skilled in the art will appreciate that the device 11a can utilize any semiconductor chip structure. For purposes of this example, the chip structure is configured as a source of energy somewhere in the 380-460 nm range, for example, having substantial energy emissions in that range such as a predominant peak at or about 450 nm. The simplified example shows a LED type semiconductor chip formed of two layers 13a, 15a. Those skilled in the art will recognize that actual chips may have a different number of device layers.

Semiconductor devices such as the light emitting device formed by layers 13a, 15a exhibit emission spectra having a relatively narrow peak at a predominant wavelength, although some such devices may have a number of peaks in their emission spectra. Such devices may be rated with respect to the intended wavelength of the predominant peak, although there is some variation or tolerance around the rated value, from chip to chip due to manufacturing tolerances. The semiconductor chip in the solid state device 11a will have a predominant wavelength in the 380-460 nm range. For example, the chip in the example of FIG. 3A is rated for a 450 nm output, which means that it has a predominant peak in its emission spectra at or about 450 nm (within the manufacturer's tolerance range of that rated wavelength value). Examples of devices 11a, however, may use chips that have additional peaks in their emission spectra.

In the example of FIG. 3A, the white light device 11a also includes a housing 25a. The epoxy may substantially encapsulate the chip. The housing and the light transmissive dome 23a together form the package enclosing the LED chip, in this example. Typically, the housing 25a is plastic, ceramic or in some cases at least partially metallic, e.g. with a metal heat slug (not separately shown) to provide good heat conductivity so as to facilitate dissipation of heat generated during operation of the LED. Internal reflectors, such as the reflective cup 17a, direct energy in the desired direction and reduce internal losses.

The white light emitting device 11a also incorporates an appropriately formulated phosphor material within the device package itself, to enable the device 11 to produce the desired white light. The phosphor material may include a single phosphor or a mixture of phosphors. Each such phosphor may be any of a number of different types of phosphors, such as rare earth phosphors, semiconductor nanophosphors, and doped semiconductor nanophosphors. For white light devices, the material often includes a mixture of two or more of these phosphors. The phosphors are all excited by the energy from the chip, however, the emission spectra of different phosphors in such a mixture are different. Each type of phosphors re-emits visible light of a different spectral characteristic.

The phosphors could be at various locations and formed in various ways within the package of the solid state device 11a. For example, the phosphors could be part of or coated on a reflective material of the cup 17a. In the illustrated example, however, the mix of phosphors is located across the optical output of the solid state device 11a, as shown at 27a in the drawing. The phosphors 27a for example could be in a coating over the outside of an epoxy dome, or the phosphor particles could be doped or otherwise embedded in a portion (as shown) or all of the epoxy forming the dome 23 itself. At least some semiconductor nanophosphors degrade in the presence of oxygen, reducing the useful life of the nanophosphors. Hence, it may be desirable to use materials and construct the device 11 so as to effectively encapsulate the phosphors 27a in a manner that blocks out oxygen, to prolong useful life of the phosphors.

The structural configuration of the solid state light emitter 11a shown in FIG. 3A is presented here by way of example only. Those skilled in the art will appreciate that the lamp examples using white light type emitters can utilize any solid state light emitting device structure that provides light that is at least substantially white. In several examples using such white light emitters, the solid state white light emitters rated for emitting light that is at least substantially white at a color temperature greater than 4,260° Kelvin, e.g. at 5,000° Kelvin.

Figure 3B:
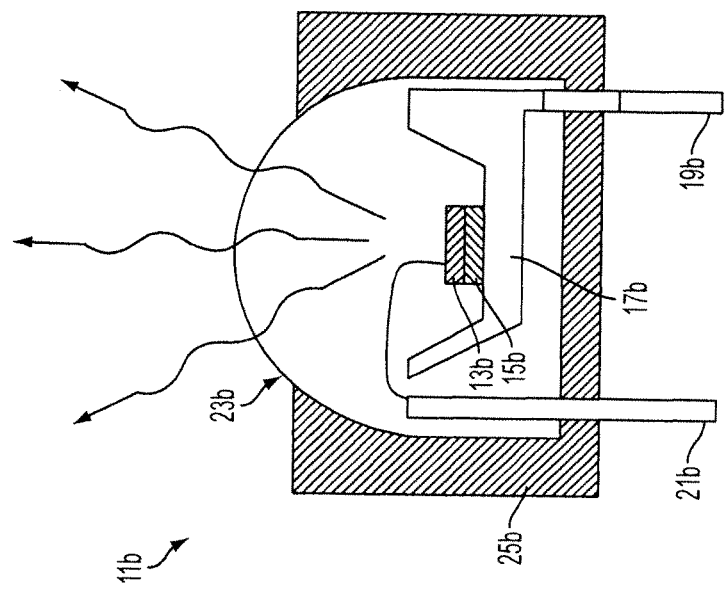
FIG. 3B is a simplified cross-sectional view of a narrower band solid state light emitter which may be used in other lamp examples.
Figure 3A:
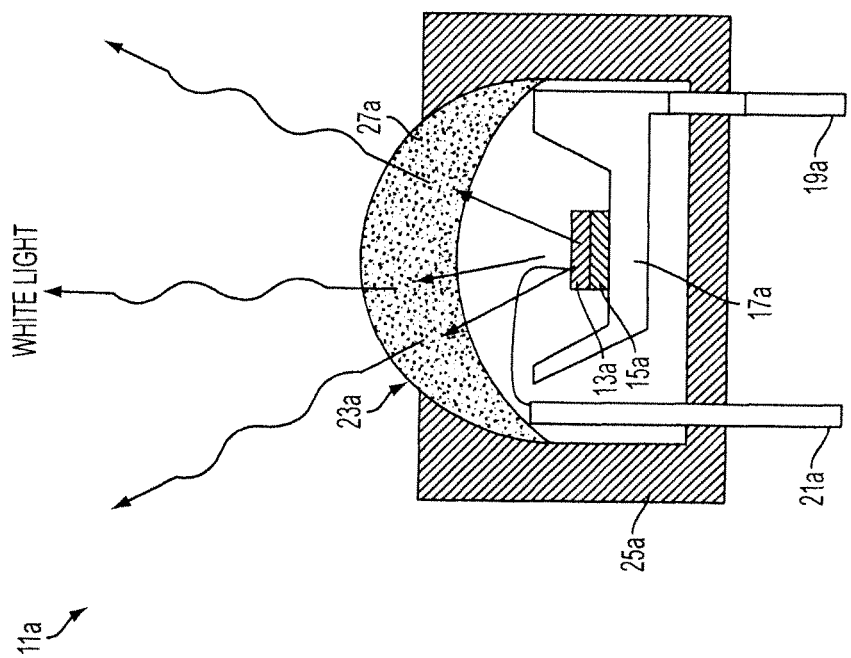
FIG. 3A is a simplified cross-sectional view of a white light solid state light emitter which may be used in some of the lamp examples.

Attention is now directed to FIG. 3B illustrating a simplified cross-sectional view of a narrower band solid state light emitter which may be used in one or more of the lamp examples. FIG. 3B illustrates a simple example of another LED type device 11b, in cross section. The exemplary structure of the LED type device 11b may be used for any device intended to emit non-white light, e.g. rated for a particular or principal color of light emission. For most of the discussions here, the exemplary configuration of the LED type device 11b is for a device rated to emit energy of any of the wavelengths from the blue/green region around 460 nm down into the UV range below 380 nm. Some specific examples are rated for 405 nm emission and other specific examples are rated for 450 nm emission. In the example of FIG. 3B, the solid state light emitter 11b includes at least one semiconductor chip, each chip comprising two or more semiconductor layers 13b, 15b forming the actual LED device. The semiconductor layers 13b, 15b of the chip are mounted on an internal reflective cup 17b, formed as an extension of a first electrode, e.g. the cathode 19b. The cathode 19b and an anode 21b provide electrical connections to layers of the semiconductor chip device within the packaging for the solid state light emitter 11b. In the example, an epoxy dome 23b (or similar transmissive part) of the enclosure allows for emission of the electromagnetic energy from the chip in the desired direction.

In the example shown in FIG. 3B, the solid state light emitter 11b also includes a housing 25b that completes the packaging/enclosure for the solid state light emitter. At least for many modern lighting applications, the housing 25b is plastic or ceramic, e.g. with a metal heat slug (not separately shown) to provide good heat conductivity so as to facilitate dissipation of heat generated during operation of the LED. Internal "micro" reflectors, such as the reflective cup 17b, direct energy in the desired direction and reduce internal losses. One or more elements in the package, such as the reflector 17b or dome 23b may be doped or coated with phosphor materials as in the device of FIG. 3A. However, the solid state emitter used in lamp example 11b relies on remote phosphor deployment to convert narrow band energy to the broader band energy intended to provide white light of desirable quality, therefore, phosphor doping integrated in (on or within) the package is not required. For certain remote phosphor deployment examples, discussed in more detail later, the solid state light emitter 11b in FIG. 3B can be rated to emit electromagnetic energy of a wavelength in the blue/green region around 460 nm down into the UV range below 380, such as at 450 nm or 405 nm.

Semiconductor devices rated for a particular wavelength, such as the solid state light emitter 11b in FIG. 3B, exhibit emission spectra having a relatively narrow peak at a predominant wavelength, although some such devices may have a number of peaks in their emission spectra. Often, manufacturers rate such devices with respect to the intended wavelength $\lambda$, of the predominant peak, although there is some variation or tolerance around the rated value, from device to device. Solid state light emitters such as device 11b for use in certain exemplary lamps will have a predominant wavelength $\lambda$, in the range at or below 460 nm ($\lambda \leq 460$ nm). The lamp may use devices that have additional peaks in their emission spectra.

The structural configuration of the solid state light emitter 11b shown in FIG. 3B is presented here by way of example only. Those skilled in the art will appreciate that the lamp examples can utilize any narrower band solid state light emitting device structure, where the device is configured as a source of electromagnetic energy in the wavelength range that is relevant for excitation of a particular remotely deployed phosphor or phosphor mixture, for example, having substantial energy emissions in that range $\lambda \leq 460$ nm, such as in a range of 380-460 nm.

Turning attention back to FIG. 1A, the solid state light emitters 32 are positioned on the pedestal 33 positioned inside bulb 31. The pedestal 33 extends into the interior of the bulb 31 supporting the solid state light emitters in orientations such that emissions from the solid state light emitters 32 through the bulb 31 approximate light source emissions from a filament of an incandescent lamp. The pedestal 33 includes a multi-surfaced three-dimensional thermal core that provides support for the solid state light emitters 32 in the interior of the bulb 31. The multi-surfaced three-dimensional thermal core is made of a durable heat conducting material such as copper (Cu), aluminum (Al), thermally conductive plastics or ceramics. An example of a ceramic material is commercially available from CeramTec GmbH of Plochingen, Germany. Composite structures, such as might have a conductive outer material and graphite core or a metal core with an outer dielectric layer are also contemplated. In some cases, the emitters are mounted on a circuit board attached to the core, whereas in other examples, electrical traces for the circuitry may be integrated with the core and the emitters mounted directly to the core without use of an additional circuit board element. Different materials are selected as a trade off of manufacturing cost/complexity versus effective heat transfer.

With respect to the shape of the bulbs 31 in FIGS. 1A-2, the bulb and overall lamp shape as well as the light output intensity distribution correspond to current A-lamp parameters. Other bulb structures, however, may be used. A few examples include globe-and-stem arrangement for a decorative globe type omni-directional lighting; and R-lamp and Par-lamp style bulbs for different directed lighting applications. Some internal surfaces of the directional bulbs may be reflective, to promote the desired output distributions.

In any of the various shapes, the bulb 31 can be a diffusely transmissive or transparent glass or plastic bulb and exhibit a form factor within standard size, and the output distribution of light emitted via the bulb 31 conforms to industry accepted specifications, for a particular type of lamp product. Other appropriate transmissive materials may be used. For a diffuse outward appearance of the bulb, the output surface may be frosted white or translucent. Those skilled in the art will appreciate that these aspects of the lamp 30 facilitate use of the lamp as a replacement for existing lamps, such as incandescent lamps and compact fluorescent lamps.

The pedestal 33 supports the solid state emitters 32 by way of a multi-surfaced three-dimensional thermal core providing the support for the solid state light emitters in the interior of the bulb 31. A variety of multi-surfaced shapes may be used for a thermal core to support one or more solid state light emitters for outward emission. The three-dimensional thermal core has three lateral surfaces for supporting the solid state light emitters 32; and may or may not include an end face for supporting one or more solid state light emitter 32a. Also, the example uses a number of emitters, although it may be possible to use as few as one emitter. The solid state light emitters 32 are supported on the three-dimensional thermal core. In certain examples, three packaged LEDs 32 are present on each of the lateral surfaces, and one LED 32a appears on an end face. LED 32a is supported on an end of the pedestal in such an orientation so that a principal direction of emission of light from the at least one solid state light emitter is substantially the same as or parallel with a longitudinal axis of the lamp. At least some of the LEDs 32 are supported on the pedestal in an orientation where principal directions of light emissions from respective emitters are radial outward from the pedestal through the bulb in different radial directions.

In addition to the core, the pedestal includes a portion of a heat transfer element, represented by a heat pipe 38 (FIG. 2). Those skilled in the art will appreciate that other transfer elements may be used in place of the heat pipe, depending on cost/performance considerations. The heat pipe extends from the heat sink along a longitudinal axis of the light engine/lamp into a region surrounded by the bulb. The heat pipe is attached to the heat sink member so as to support the core and thus support the solid state light emitters. An end face of the core includes an opening for insertion of the heat pipe into the core. A type of coupling with good heat transfer is provided in one of several ways. For example, a thermal adhesive may be provided, the core may soldered onto the heat pipe, or the core may be pressed or heat shrink fitted onto the heat pipe. Although the core and transfer element may be formed as an integral member, in the example, they are two separate elements joined or attached together.

A flexible printed circuit board can include the solid state light emitters positioned on tabs of the flexible circuit board. The board may be rigid with flexibly connected tabs, the entire board may be flexible or some or all of the board may be bendable (e.g. with a bendable metal core). In certain examples the solid state emitters 32 are mounted on flexible circuit board and the flexible circuit board is fixedly secured to the three-dimensional thermal core by way of flexible tabs on which the solid state emitters 32 are mounted. When installed on the three-dimensional thermal core, each of the tabs can be bent to allow the tabs to be fixedly secured to the lateral sides of the three-dimensional thermal core by way of solder or a thermally conductive adhesive. An end face of the flexible circuit board can include a single solid state emitter 32a and is fixedly secured to an end face of the three-dimensional thermal core by way of solder or a thermally conductive adhesive.

The printed circuit board and emitters may be attached to the faces of the core by an adhesive or a solder. If solder is used, the solder to first attach the emitters to the board may melt at a higher temperature than the solder used to attach the board to the core, to facilitate assembly.

In certain specific examples, one emitter 32a is on the end face and three emitters 32 on each of the lateral surfaces of the core, with the emitters on each lateral surface arranged in a line approximately parallel to the central longitudinal axis of the core/pipe/engine/lamp. Those skilled in the art will recognize that there may be different numbers of emitters on the end face and/or on any or all of the different lateral surfaces. Also, on any face or surface having a number of emitters, the emitters may be arranged in a different pattern than that shown, for example, so as to adapt emitters in a different type of package or having a different individual output pattern can be arranged such that emissions from the solid state light emitters through the bulb sufficiently approximate light source emissions from a filament of an incandescent lamp.

Although not shown, alternative examples for including the solid state light emitters on the thermal core include packaged solid state light emitters, such as LEDs, positioned on a three-dimensional solid printed circuit board core. In examples where the circuitry is formed integrally with the core, the core can be a ceramic material or thermally conductive plastic material with electrical traces, or a metallic core (such as aluminum) with a dielectric layer and traces (similar to metal core board construction). In yet another example, light emitting diode dies can be positioned on a three-dimensional solid printed circuit board core. The core in that example can be a ceramic material or thermally conductive plastic material with electrical traces, or a metallic core (such as aluminum) with a dielectric layer and traces (similar to metal core board construction). As described in further detail for FIG. 2, a heat pipe or other thermal transfer element can serve a dual role for supporting the solid state emitters and assisting with removal of heat generated during operation of the solid state light emitters.

The lamp base 35 (FIGS. 1A-2) may be any common standard type of lamp base, to permit use of the lamp 30/40 in a particular type of lamp socket. The lamp base 35 may have electrical connections for a single intensity setting or additional contacts in support of three-way intensity setting/dimming. Common examples of lamp bases include an Edison base, a mogul base, a candelabra base and a bi-pin base. It is understood that an adaptor (intermediate to the base 35 and heat sink 36) can be used to accommodate the different sizes of standard lamp bases for attachment at the modular coupling on the heat sink of the lamp 30/40. For simplicity, two examples of lamp bases are shown in FIGS. 4 and 5.

Figure 4:
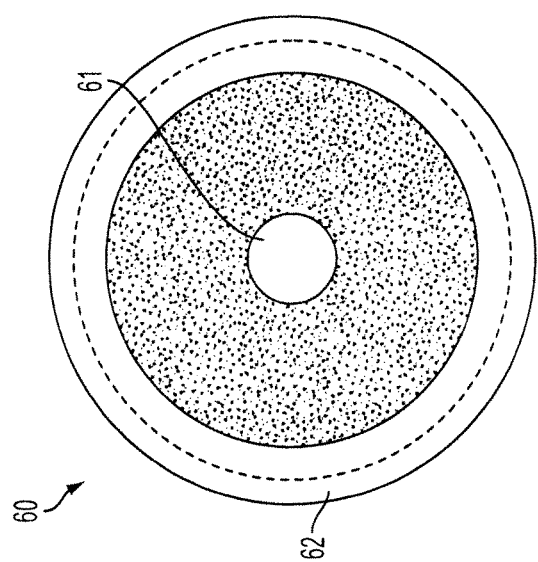
FIG. 4 is a plan view of a screw type lamp base, such as an Edison base or a candelabra base.

FIG. 4 is a plan view of a screw type lamp base, such as an Edison base or a candelabra base. For many lamp applications, the existing lamp socket provides two electrical connections for AC main power. The lamp base in turn is configured to mate with those electrical connections. FIG. 4 is a plan view of a two connection screw type lamp base 60, such as an Edison base or a candelabra base. As shown, the base 60 has a center contact tip 61 for connection to one of the AC main lines. The threaded screw section of the base 60 is formed of metal and provides a second outer AC contact at 62, sometimes referred to as neutral or ground because it is the outer casing element. The tip 61 and screw thread contact 62 are separated by an insulator region (shown in gray).

Figure 5:
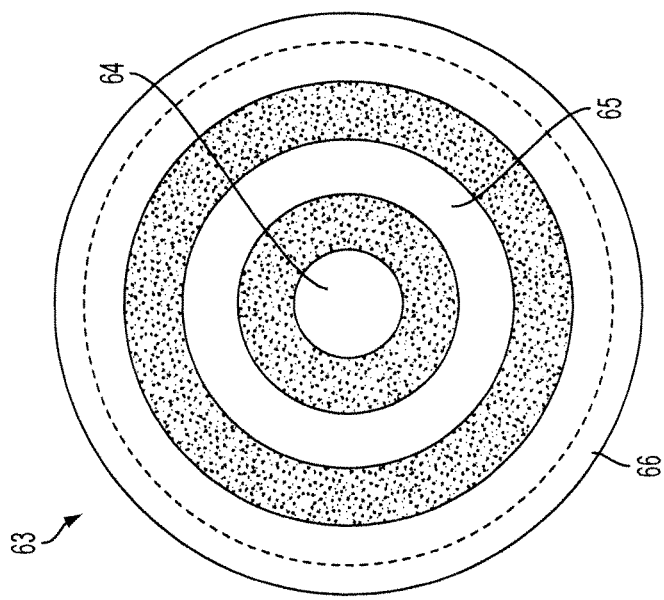
FIG. 5 is a plan view of a three-way dimming screw type lamp base, such as for a three-way mogul lamp base or a three-way medium lamp base.

FIG. 5 is a plan view of a three-way dimming screw type lamp base, such as for a three-way mogul lamp base or a three-way medium lamp base. Although other base configurations are possible, the example is that for a screw-in base 63 as might be used in a three-way mogul lamp or a three-way medium lamp base. As shown, the base 63 has a center contact tip 64 for a low power connection to one of the AC main lines. The three-way base 63 also has a lamp socket ring connector 65 separated from the tip 64 by an insulator region (shown in gray). A threaded screw section of the base 63 is formed of metal and provides a second outer AC contact at 66, sometimes referred to as neutral or ground because it is the outer casing element. The socket ring connector 65 and the screw thread contact 66 are separated by an insulator region (shown in gray).

Many of the components, in the form of a light engine, can be shared between different types/configurations of lamps. For example, the heat sink and pedestal may be the same for an Edison mount A lamp and for three-way A lamp. The lamp bases would be different. The drive circuitry would be different, and possibly the number and/or rated output of the emitters may be different.

The solid state light emitters in the various exemplary lamps may be driven/controlled by a variety of different types of circuits. Depending on the type of solid state emitters selected for use in a particular lamp product design, the solid state emitters may be driven by AC current, typically rectified; or the solid state emitters may be driven by a DC current after rectification and regulation. The degree of control may be relatively simple, e.g. ON/OFF in response to a switch, or the circuitry may utilize a programmable digital controller, to offer a range of sophisticated options. Intermediate levels of sophistication of the circuitry and attendant control are also possible.

As shown in cross-section in FIG. 2, vertically positioned circuit board 37 is illustrated. The circuit board 37 is the circuitry provided for driving the plurality of solid state light emitters and is positioned inside the lamp base 35. In this example the circuit board 37 extends vertically upward from the base in an interior space within the heat sink 36. As shown in FIG. 2, the heat pipe 38 coils around a portion of the circuit board 37. The lamp 40 in FIG. 2 has a lighting industry standard lamp base 35 modularly connected to the heat sink 36 and electrically connected to provide alternating current electricity to the circuit board 37 for driving the solid state light emitters 32 supported on the pedestal.

The examples also encompass heat dissipation technology to provide good heat conductivity so as to facilitate dissipation of heat generated during operation of the solid state light emitters 32. Hence, the exemplary lamp 30 in FIGS. 1A-1B or 40 in FIG. 2 includes one or more elements forming a heat or thermal handling system for receiving heat produced by the solid state light emitters 32 and transferring that heat to a sink for dissipation to the ambient atmosphere. Active dissipation, passive dissipation or a combination thereof may be used, although the illustrated examples do not include an active heat dissipation component. In the examples, the thermal handling system includes the core formed on or attached to a portion of the heat pipe or other heat transfer element and a heat sink coupled to an opposite end of the heat transfer element. The fins 36a/36a' on the heat sink extend along the outside of the lamp between the bulb and the lamp base and include one or more openings or passages between the fins, for allowing flow of air, to dissipate heat from the fins 36a/36a' of the heat sink 36/36'. Although not shown, air passages may also be provided through the coupling of the heat sink to the bulb and or to/from the interior of the inner optical processing member to allow flow of air around the emitters and venting thereof to the exterior of the lamp.

Light emitted from the solid state emitters 32 is permitted to pass out upward and laterally through the bulb 31 and substantially downward between the spacing between adjacent fins 36a/36a'. Thus, light from the solid state emitters is dispersed upwards, laterally and downward, for example, for omni-directional lighting of a room from a table or floor lamp. The orientation shown, however, is purely illustrative. The lamp 30/40 may be oriented in any other direction appropriate for the desired lighting application, including downward, any sideways direction, various intermediate angles, etc.

The light output intensity distribution from the lamp 30/40 corresponds at least substantially to that currently offered by A-lamps. Other bulb/container structures, however, may be used; and a few examples include a bulb-and-stem arrangement for a decorative globe lamp type omni-directional lighting, as well as R-lamp and Par-lamp style bulbs for different directed lighting applications. At least for some of the directed lighting implementations, some internal surfaces of the bulbs may be reflective, to promote the desired output distributions.

The heat pipe 38 is provided to assist in the removal of heat generated by the solid state emitters 32 present on the pedestal. The heat pipe is a heat transfer mechanism that combines the principles of both thermal conductivity and phase transition to efficiently manage the transfer of heat. In FIG. 2, solid state light emitters near the end of the heat pipe inside the bulb generate heat. This heat should be effectively removed in order to prolong the operating life of the solid state emitters. At the hot interface within the heat pipe, a liquid contained within the heat pipe comes into contact with a thermally conductive solid surface adjacent to the solid state light emitters and turns into a vapor by absorbing heat from that surface. The vapor condenses back into a liquid at a cold interface away from the solid state light emitters, releasing the latent heat to the heat sink for dissipation through the fins to the air in the gaps between adjacent fins 36a/36a' of the heat sink 36/36'. The liquid then returns to the hot interface adjacent the light emitters through capillary action where it evaporates once more and repeats the cycle. In addition, the internal pressure of the heat pipe can be set or adjusted to facilitate the phase change depending on the demands of the working conditions of the lighting application of the lamp.

The modularity of the solid state lamp will now be described further with reference to FIG. 2. The heat sink 36 includes a first modular-coupling 36b for attachment of one of the various different lighting industry standard lamp bases 35. The heat sink 36 also includes a second modular-coupling 36c for attachment of one of the different types of bulbs 31 each corresponding to a respective one of the applicable industry standard types of lamps. The heat sink 36 has an optional third modular-coupling 36d for attachment of one of a number of different types of light transmissive optical processing members 34 radially surrounding and spaced from the solid state light emitters 32. The optical processing member 34 may be transparent or diffusely transmissive, without phosphor. In most examples, however, the member 34 also serves as the carrier for providing remote deployment of a phosphor material to process light from the solid state emitters 32. Different phosphor mixtures or formulations, deployed by different members 34 enable different instances of the lamp to produce white light as an output of the lamp through the bulb at different color temperatures. Some different phosphor formulations also offer different spectral qualities of the white light output.

As further shown in FIG. 2, the heat pipe 38 extends upward from the heat sink 36 along a longitudinal axis of the light engine into a region to be surrounded by the bulb 31 when attached to the heat sink 36 at the second modular-coupling 36c, the heat pipe 38 providing heat conductivity to and being supported by the heat sink 36. Multiple solid state light emitters 32 are supported on the heat pipe in orientations to emit light outward from the pedestal such that emissions from the solid state light emitters 32 through the bulb 31 when attached to the heat sink 36 approximate light source emissions from a filament of an incandescent lamp as discussed above with regard to earlier examples.

As noted earlier, a variety of multi-surfaced shapes may be used for a core to support one or more solid state light emitters. In the example shown in FIG. 2, the heat pipe end supporting the solid state light emitters 32 and positioned within the cavity of bulb 31, can be molded or shaped in a multi-surfaced three-dimensional core with three lateral surfaces to support the solid state light emitters 32. Thus, in this example, the heat pipe also integrates the core of the pedestal for supporting the solid state emitters. In the example shown in FIG. 1A, the pedestal includes a three-dimensional thermal core and an end of the heat pipe together providing the support for the solid state light emitters 32, and the three-dimensional thermal core has three lateral surfaces supporting solid state light emitters 32 and an end face supporting at least one solid state light emitter 32a. As further shown in FIG. 2, circuitry in the form of circuit board 37, is at least partially enclosed by the heat sink connected to drive the solid state emitters 32 in response to electricity received from lamp base 35 when attached to the heat sink 36 at the first modular-coupling 36b.

The modular coupling capability of the heat sink 36, together with the bulb and base that connect to the heat sink, provide a 'light engine' portion of the lamp for generating white light. Theoretically, the engine and bulb could be modular in design to allow a user to interchange glass bulbs, but in practice the lamp is an integral product. The light engine may be standardized across several different lamp product lines (A-lamps, R-lamps, Par-lamps or other styles of lamps, together with Edison lamp bases, three-way medium lamp bases, etc.). The modularity facilitates assembly of common elements forming the light engine together with the appropriate bulb and base (and possibly different drive circuits on the internal board), to adapt to different lamp applications/configurations.

As referenced above, the lamp described in certain examples will include or have associated therewith remote phosphor deployment. The phosphor(s) will be external to the solid state light emitters 32. As such, the phosphor(s) are located apart from the semiconductor chips of the solid state emitters used in the particular lamp, that is to say remotely deployed with respect to the solid state emitters. The phosphor(s) are of a type for converting at least some portion of light from the solid state light emitters from a first spectral characteristic to a second spectral characteristic, to produce a white light output of the lamp from the bulb.

As shown in FIGS. 1A-2, an inner optical processing member 34 remotely deploys the phosphor(s) with respect to the solid state light emitters 32. In conjunction with the phosphor bearing inner member 34, or as an alternative, the phosphor can be deployed on an inner surface of the bulb 31 facing the solid state light emitters. Although one or both may be transparent, the inner member 34 alone, or together with the bulb 31 can be diffusely transmissive.

For the lamp implementations with remotely deployed phosphor, the member and its support of the phosphor may take a variety of different forms. Solid examples of the member 34 may be transparent or diffusely transmissive. Glass, plastic and other materials are contemplated for the member 34. The phosphors may be embedded in the material of the member or may be coated on the inner surface and/or the outer surface of the member 34. The member may also allow air flow, for example, through passages (not shown). In another approach, the member 34 is formed of a permeable mesh coated with the phosphor material.

The inner member 34 of the examples shown in FIGS. 1A-2, is a cylinder and dome like structure. Those skilled in the art will recognize that other shapes may be used for the member, such as a globe on a stalk, a hemisphere or even multi-sided shapes like various polygon shapes. The inner member is made of a material that is at least partially light transmissive and radially and longitudinally extends around the solid state light emitters that are supported on the pedestal between an inner surface of the bulb and the solid state light emitters. The inner member 34 is positioned around the solid state light emitters 32 and can include one or more remotely deployed phosphors. In a particular example, one or more semiconductor nanophosphors can be dispersed on an inner and/or outer surface of the inner member, such as by spray coating (or other industry recognized phosphor application technique) of the one or more semiconductor nanophosphors with a carrier/binder on a transmissive or diffusely transmissive surface of the inner member 34.

Figure 9:
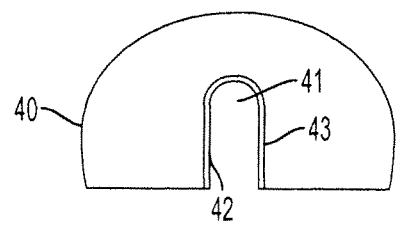
FIG. 9 is a view of one example of remote phosphor deployment in a lamp.

In certain alternative examples, shown in FIG. 9, the inner member 43 forms at least one wall of a gas-tight container 40 enclosing the phosphor 42. The gas-tight container 40 is filled with a gas 41 that is at least substantially oxygen free, that is to say, has an oxygen level that is low as commercially feasible. Examples of a suitable gas 41 include nitrogen. By preventing exposure of the nanophosphors to oxygen, the operating life of the nanophosphors increases. In the example of FIG. 9, the bulb and the inner member together form a container for the gas and the phosphor. The nanophosphor could be coated on the interior of the bulb, although in the example, the nanophosphor is coated on the surface of the member within the container (opposite the surface of the member facing the emitters).

Figure 10:
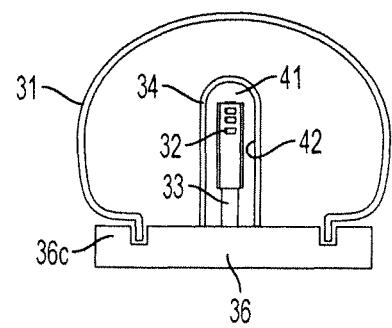
FIG. 10 is a view of another example of remote phosphor deployment in a lamp.

FIG. 10 illustrates yet another example of remote phosphor deployment using a gas 41, such as nitrogen, that is at least substantially oxygen free. The example in FIG. 10 is similar to the structure for FIG. 1A. An inner surface of the inner member 34 facing the pedestal 33 and solid state emitters 32 is coated or impregnated with phosphor material. Nitrogen gas 41 is provided in the spacing between the pedestal 33 and the inner member 34. The globe is modularly connected to an upper surface of the heat sink 36 by way of modular-coupling region 36c. The pedestal with the emitters would be inserted into the interior volume enclosed by the member 34, the nitrogen or other oxygen free/low oxygen gas would be supplied into that volume and the volume sealed.

In another example, an oxygen barrier is formed by the outer bulb allowing the inner member to be gas permeable.

Figure 11:
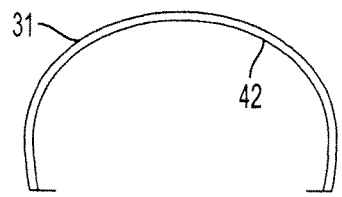
FIG. 11 is a view of the bulb including remote phosphor on an inner surface of the bulb.

In the example of FIG. 11, no inner member is present, but instead the phosphor 42 is deployed on an inside surface of the bulb 31 facing the solid state light emitters (not shown).

As outlined earlier, the solid state lamps in the examples produce light that is at least substantially white. Although output of the light from the emitters may be used, the color temperature and/or spectral quality of the output light may be relatively low and less than desirable, particularly for high end lighting applications. Thus, many of the examples add remote phosphor to improve the color temperature and/or spectral qualities of the white light output of the lamps.

A variety of conventional phosphors may be used. Recently developed quantum dot (Q-dot) phosphors or doped quantum dot (D-dot) phosphors may be used. Phosphors absorb excitation energy then re-emit the energy as radiation of a different wavelength than the initial excitation energy. For example, some phosphors produce a down-conversion referred to as a "Stokes shift," in which the emitted radiation has less quantum energy and thus a longer wavelength. Other phosphors produce an up-conversion or "Anti-Stokes shift," in which the emitted radiation has greater quantum energy and thus a shorter wavelength. Quantum dots (Q-dots) provide similar shifts in wavelengths of light. Quantum dots are nano scale semiconductor particles, typically crystalline in nature, which absorb light of one wavelength and re-emit light at a different wavelength, much like conventional phosphors. However, unlike conventional phosphors, optical properties of the quantum dots can be more easily tailored, for example, as a function of the size of the dots. In this way, for example, it is possible to adjust the absorption spectrum and/or the emission spectrum of the quantum dots by controlling crystal formation during the manufacturing process so as to change the size of the quantum dots. Thus, quantum dots of the same material, but with different sizes, can absorb and/or emit light of different colors. For at least some exemplary quantum dot materials, the larger the dots, the redder the spectrum of re-emitted light; whereas smaller dots produce a bluer spectrum of re-emitted light. Doped quantum dot (D-dot) phosphors are similar to quantum dots, but are also doped in a manner similar to doping of a semiconductor. Variation in the proportions or percentages of different phosphors with respect to the total amount of phosphors in a mix adapts a particular lamp design to output different color temperatures of white light.

In some examples using phosphor luminescence, the solid state emitters produce light that is at least substantially white. In certain white light examples, the solid state light emitters are emitters for emitting light that is at least substantially white at a color temperature greater than 4,260° Kelvin, e.g. at a first color temperature of approximately 5,000° Kelvin or even higher. In these implementations, phosphor(s) remotely deployed in the lamp via the member 34 convert some of that light so that the lamp output is at least substantially white, but at a second color temperature lower than the first color temperature. In these examples, the phosphors are selected and mixed so as to convert enough of the light from white light LEDs at the first color temperature emitted to produce a combined output of the lamp that exhibits color temperature in one of four specific ranges along the black body curve listed in Table 1 below.

TABLE 1

Nominal Color Temperatures and Corresponding Color Temperature Ranges

| Nominal Color Temp. (° Kelvin) | Color Temp. Range (° Kelvin) |
|---|---|
| 2700 | 2725 ± 145 |
| 3000 | 3045 ± 175 |
| 3500 | 3465 ± 245 |
| 4000 | 3985 ± 275 |

In Table 1, each nominal color temperature value represents the rated or advertised temperature as would apply to particular lamp having an output color temperature within the corresponding range.

As noted a variety of phosphors may be used. In the examples using white light emitters, for example, mixtures of quantum dot (Q-dot) type semiconductor nanophosphors are available to produce the white light output at the desired color temperature. To improve the spectral quality of the output light a rare earth phosphor may be added to or substituted into a mixture of the quantum dot (Q-dot) type semiconductor nanophosphors, for any one or each of the mixtures for producing the output in the desired color temperature range. The excited phosphor(s) together with light from the emitters produce output light from the lamp that is at least substantially white and has a color rendering index (CRI) of 75 or higher. With any of these phosphor strategies using white light emitters (see e.g., FIG. 3A), the implementations can use different phosphor combinations/mixtures deployed via different instances of the inner member 34 to produce lamps with white light output at different color temperatures and/or of different spectral quality.

One or two of the nanophosphors may be used to produce a relatively mono-chromatic light output or a light output that appears somewhat less than full white to a person. However, in many commercial examples for general lighting or the like, the lamp produces white light of desirable characteristics using a number of semiconductor nanophosphors. The phosphor bearing material may use a combination of semiconductor nanophosphors, or a combination of one or more nanophosphors with at least one rare earth phosphor.

Figure 6A:
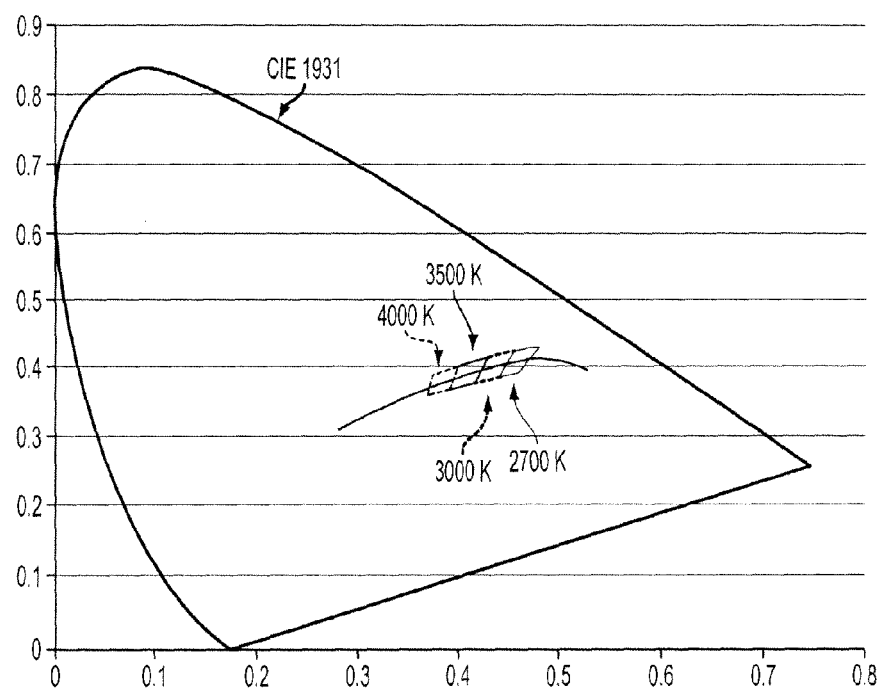
FIGS. 6A and 6B are color charts showing the black body curve and tolerance quadrangles along that curve for chromaticities corresponding to several desired color temperature ranges for white light applications.

In Table 1 above, each nominal color temperature value represents the rated or advertised temperature as would apply to particular lamp using white light LEDs having an output color temperature within the corresponding range. The color temperature ranges fall along the black body curve. FIG. 6A shows the outline of the CIE 1931 color chart, and the curve across a portion of the chart represents a section of the black body curve that includes the desired CIE color temperature (CCT) ranges. The light may also vary somewhat in terms of chromaticity from the coordinates on the black body curve. The quadrangles shown in the drawing represent the respective ranges of chromaticity for the nominal CCT values. Each quadrangle is defined by the range of CCT and the distance from the black body curve. Table 2 below provides chromaticity specifications for the four color temperature ranges. The x, y coordinates define the center points on the black body curve and the vertices of the tolerance quadrangles diagrammatically illustrated in the color chart of FIG. 6A.

TABLE 2

Chromaticity Specification for the Four Nominal Values/CCT Ranges

| | CCT Range | | | | | | | |
|---|---|---|---|---|---|---|---|---|
| | 2725 ± 145 | | 3045 ± 175 | | 3465 ± 245 | | 3985 ± 275 | |
| | Nominal CCT | | | | | | | |
| | 2700° K | | 3000° K | | 3500° K | | 4000° K | |
| | x | y | x | y | x | y | x | y |
| Center point | 0.4578 | 0.4101 | 0.4338 | 0.4030 | 0.4073 | 0.3917 | 0.3818 | 0.3797 |
| Tolerance Quadrangle | 0.4813 | 0.4319 | 0.4562 | 0.4260 | 0.4299 | 0.4165 | 0.4006 | 0.4044 |
| | 0.4562 | 0.426 | 0.4299 | 0.4165 | 0.3996 | 0.4015 | 0.3736 | 0.3874 |
| | 0.4373 | 0.3893 | 0.4147 | 0.3814 | 0.3889 | 0.369 | 0.367 | 0.3578 |
| | 0.4593 | 0.3944 | 0.4373 | 0.3893 | 0.4147 | 0.3814 | 0.3898 | 0.3716 |

Another approach, offering yet higher spectral quality at the specified color temperatures and/or at additional color temperature ranges and listed later (see Table 3), uses solid state light emitters 32 of any type rated to emit energy of wavelengths from the blue/green region around 460 nm down into the UV range below 380 nm (see e.g., FIG. 3B). Some specific examples use a 450 nm type emitter, whereas other specific examples use a 405 nm emitter. In these arrangements, the phosphor bearing material may use a combination of semiconductor nanophosphors, a combination of one or more nanophosphors and optionally one or more other phosphor(s) including rare earth phosphors, or a combination in which one or more of the phosphors is a doped semiconductor nanophosphor. For example, with 450 nm type emitters, the mixture may contain one or more semiconductor nanophosphors with at least one rare earth phosphor; whereas with 405 nm type emitters, the mixture may contain one or more doped semiconductor nanophosphors although the mixture may also include a rare earth or other conventional phosphor. Each phosphor or nanophosphor is of a type for converting at least some portion of the wavelength range from the particular solid state emitters to a different range of wavelengths. The combined emissions of the pumped phosphors alone or in combination with some portion of remaining light from the emitters results in a light output that is at least substantially white, is at a desired color temperature and may exhibit other desired white light characteristics. In these specific examples, the one or more of the phosphors is a doped semiconductor nanophosphor. The doped semiconductor nanophosphor is of a type for converting at least some portion of the wavelength range from the solid state emitters to a different range of wavelengths. The combined emissions of the pumped phosphors alone or in combination with some portion of remaining light from the emitters results in a light output that is at least substantially white, is at a desired color temperature and may exhibit other desired white light characteristics.

The selected phosphors are excitable by the relevant spectrum of light from the solid state light emitters 32. When excited by light emitted by the solid state light emitters, each phosphor in a mixture emits visible light in a characteristic emission spectrum.

At least for some types of phosphors, e.g. doped semiconductor nanophosphors, the various emission spectra are separated from the absorption spectra of the nanophosphors included in a light output from the lamp. This tends to reduce re-absorption of phosphor emissions.

The upper limits of the absorption spectra of certain nanophosphors are at or below 460 nm, for example, around 430 nm. However, exemplary nanophosphors (particularly doped nanophosphors) are relatively insensitive to other ranges of visible light often found in natural or other ambient white visible light. Hence, when the lamp 30/40 using such phosphors is off, the semiconductor nanophosphors will exhibit little or no light emissions that might otherwise be perceived as color by a human observer. Even though not emitting, the particles of the semiconductor nanophosphor may have some color, but due to their absorption spectrum and location inside the bulb, the overall effect is that the nanophosphor(s) cause little or no perceptible tint.

One or two of the nanophosphors may be used to produce a relatively mono-chromatic light output or a light output that appears somewhat less than full white to a person. However, in many commercial examples for general lighting or the like, the lamp produces white light of desirable characteristics using a number of semiconductor nanophosphors.

With these various types of phosphor mixtures excited by the narrower band energy from the emitters, e.g. from 405 or 450 nm LEDs in our most specific examples, when excited, each phosphor in the lamp re-emits visible light of a different spectral characteristic. However, each such phosphor emission has a somewhat different spectrum. When excited by the light received from the solid state light emitters, the phosphors together cause the lamp to produce visible light output of a desired characteristic, which is at least substantially white and has a color rendering index (CRI) of 75 or higher. The lamp output light produced by this excitation of the semiconductor nanophosphors exhibits color temperature in one of several desired ranges as specified earlier in Table 3.

TABLE 3

Nominal Color Temperatures and Corresponding Color Temperature Ranges

| Nominal Color Temp. (° Kelvin) | Color Temp. Range (° Kelvin) |
|---|---|
| 2700 | 2725 ± 145 |
| 3000 | 3045 ± 175 |
| 3500 | 3465 ± 245 |
| 4000 | 3985 ± 275 |
| 4500 | 4503 ± 243 |
| 5000 | 5028 ± 283 |
| 5700 | 5665 ± 355 |
| 6500 | 6530 ± 510 |

Figure 6B:
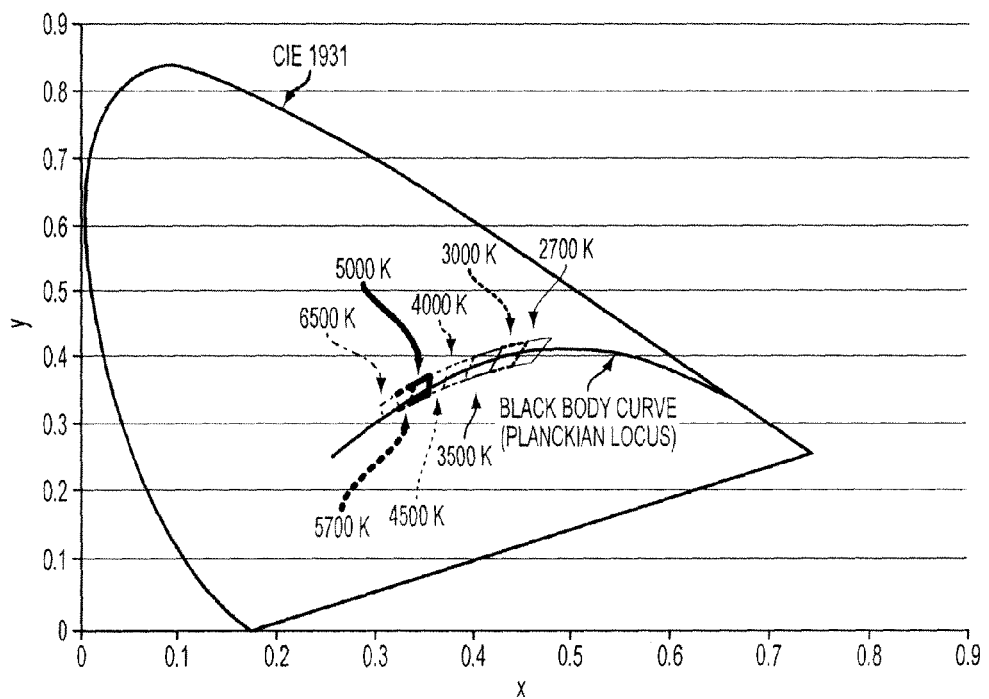

In Table 3, each nominal color temperature value represents the rated or advertised temperature as would apply to particular lamp product having an output color temperature within the corresponding range. The color temperature ranges fall along the black body curve (Planckian locus). FIG. 6B shows the outline of the CIE 1931 color chart, and the curve across a portion of the chart represents a section of the black body curve that includes the desired CIE color temperature (CCT) ranges. The light may also vary somewhat in terms of chromaticity from the color coordinates of points on the black body curve. The quadrangles shown in the drawing represent the respective ranges of chromaticity for the nominal CCT values. Each quadrangle is defined by the range of CCT and the distance from the black body curve. Tables 4 and 5 below provides chromaticity specifications for the eight exemplary color temperature ranges of FIG. 6B. The x, y coordinates define the center points on the black body curve and the vertices of the tolerance quadrangles diagrammatically illustrated in the color chart of FIG. 6B.

TABLE 4

Chromaticity Specification for Nominal Values/CCT Ranges (for rated/nominal CCTs of 2700° K to 4000° K)

| | CCT Range | | | | | | | |
|---|---|---|---|---|---|---|---|---|
| | 2725 ± 145 | | 3045 ± 175 | | 3465 ± 245 | | 3985 ± 275 | |
| | Nominal CCT | | | | | | | |
| | 2700° K | | 3000° K | | 3500° K | | 4000° K | |
| | x | y | x | y | x | y | x | y |
| Center point | 0.4578 | 0.4101 | 0.4338 | 0.4030 | 0.4073 | 0.3917 | 0.3818 | 0.3797 |
| Tolerance Quadrangle | 0.4813 | 0.4319 | 0.4562 | 0.4260 | 0.4299 | 0.4165 | 0.4006 | 0.4044 |
| | 0.4562 | 0.4260 | 0.4299 | 0.4165 | 0.3996 | 0.4015 | 0.3736 | 0.3874 |
| | 0.4373 | 0.3893 | 0.4147 | 0.3814 | 0.3889 | 0.3690 | 0.3670 | 0.3578 |
| | 0.4593 | 0.3944 | 0.4373 | 0.3893 | 0.4147 | 0.3814 | 0.3898 | 0.3716 |

TABLE 5

Chromaticity Specification for Nominal Values/CCT Ranges
(for rated/nominal CCTs of 4500° K to 6500° K)

| | CCT Range | | | | | | | |
|---|---|---|---|---|---|---|---|---|
| | 4503 ± 243 | | 5028 ± 283 | | 5665 ± 355 | | 6530 ± 510 | |
| | | | | Nominal CCT | | | | |
| | 4500° K | | 5000° K | | 5700° K | | 6500° K | |
| | x | y | x | y | x | y | x | y |
| Center point | 0.3611 | 0.3658 | 0.3447 | 0.3553 | 0.3287 | 0.3417 | 0.3123 | 0.3282 |
| | 0.3736 | 0.3874 | 0.3551 | 0.3760 | 0.3376 | 0.3616 | 0.3205 | 0.3481 |
| Tolerance | 0.3548 | 0.3736 | 0.3376 | 0.3616 | 0.3207 | 0.3462 | 0.3028 | 0.3304 |
| Quadrangle | 0.3512 | 0.3465 | 0.3366 | 0.3369 | 0.3222 | 0.3243 | 0.3068 | 0.3113 |
| | 0.3670 | 0.3578 | 0.3515 | 0.3487 | 0.3366 | 0.3369 | 0.3221 | 0.3261 |

The solid state lamp could use a variety of different combinations of phosphors to produce any output within a selected one of the CCT and chromaticity ranges of Tables 3-5. The phosphors are selected and combined in amounts that cause the output of the lighting device to exhibit the desired characteristics, in this case, to achieve a color temperature in a particular one of the ranges of Tables 3-5 and a high color rendering index. Different lamps designed for different color temperatures of white output light and/or using different types of narrow band emitter would use different formulations of mixtures of doped semiconductor nanophosphors. For example, combinations of semiconductor nanophosphors alone or with addition of a rare earth phosphor can produce such light when driven by a narrow band type LED rated for blue-green emission, such as a 450 nm LED. Semiconductor nanophosphors as might be used in these examples are available from NNCrystal of Fayetteville, Ark. and from QD Vision of Watertown, Mass. Conventional phosphors, including rare earth phosphors, for use with the semiconductor nanophosphors are available from a variety of vendors.

Some phosphor mixes can provide higher quality spectral content in the desired temperature ranges, for example, including close correspondence to or approximation of a section of the black body radiation spectrum for the rated color temperature. For these still higher light quality lamp products, our examples use at least two doped semiconductor nanophosphors that may be excited by at least some wavelengths in the 380-460 nm range. In certain of these examples, each solid state light emitter 32 is a near UV emitting LED, such as a 405 nm LED. Although other types of semiconductor nanophosphors are contemplated, we will also assume for the following discussion of these black body quality examples that each nanophosphor is a doped semiconductor of a type excited in response to light from the solid state light emitters.

Different black body quality examples of lamps designed for different color temperatures of white output light would according to Tables 3-5 use different formulations of mixtures of doped semiconductor nanophosphors.

In these latest examples, the lamp 30 (or lamp 40) could use a variety of different combinations of doped semiconductor nanophosphors alone or in combination with other phosphor(s) to produce such an output. Examples of suitable doped type semiconductor nanophosphors are available from NNCrystal of Fayetteville, Ark. In a specific example, one or more of the doped semiconductor nanophosphors comprise zinc selenide quantum dots doped with manganese or copper. The selection of one or more such nanophosphors excited mainly by the low end (460 nm or below) of the visible spectrum and/or by UV energy together with dispersion of the nanophosphors in an otherwise clear material minimizes any potential for discoloration of the lamp when the lamp in its off-state that might otherwise be caused by the presence of a phosphor material.

FIG. 7A is a radiation spectrum graph showing a wavelength range in the visible spectrum from 400 nm to 700 nm. The four curves shown on that graph represent the four different emission spectra of the exemplary blue, green, orange and red semiconductor nanophosphors used in the specific examples. The graph of FIG. 7A shows the phosphor emissions as having the same output intensity level, e.g. in a fashion normalized with respect to intensity.

In FIG. 7A, the leftmost curve represents the blue phosphor emissions. The blue phosphor is a doped semiconductor type nanophosphor. Although not shown, the absorption spectrum for this phosphor will include the 380-420 nm near UV range and extend into the UV range, but that absorption spectrum drops substantially to 0 (has an upper limit) about 450 or 460 nm. This phosphor exhibits a large Stokes shift from the short wavelength(s) of absorbed light to the longer wavelengths of re-emitted light. The emission spectrum of this blue phosphor has a broad peak in the wavelength region humans perceive as blue, e.g. centered around a wavelength approximately in the range of 470 to 475 nm in the illustrated example. The main peak of the emission spectrum of the phosphor is well above the absorption spectra of the various other semiconductor nanophosphors and well above its own absorption spectrum, although in the case of the blue example, there may be just a small amount of emissions in the region of the phosphor absorption spectra. As a result, blue emissions from this doped semiconductor nanophosphor would re-excite that phosphor at most a minimal amount. The absorption spectrum at or below 460 nm would be below the emission spectrum of the other three phosphors. Hence, the blue phosphor emissions would be subject to relatively little phosphor re-absorption, even in mixtures containing the other semiconductor nanophosphors. As shown, however, the blue phosphor provides a relatively broad radiation spectrum, as might appear as a pastel blue to a human observer.

In FIG. 7A, the next curve represents the green phosphor emissions. The green phosphor is another doped semiconductor nanophosphor. The absorption spectrum for this phosphor includes the 380-420 nm near UV range and extends down into the UV range, but that absorption spectrum drops substantially to 0 (has an upper limit) somewhere around a bit below 450 nm. As noted, the phosphor exhibits a large Stokes shift from the short wavelength(s) of absorbed light to the longer wavelengths of re-emitted light. The emission spectrum of this green phosphor has a fairly broad peak in the wavelength region humans perceive as green, e.g. centered around approximately 550 nm in the illustrated example. Again, the emission spectrum of this phosphor is well above the absorption spectra of the other doped semiconductor nanophosphors and well above its own absorption spectrum. The absorption spectrum at or below 460 nm would be below the emission spectrum of the other three phosphors, except possibly for some small overlap with the blue emission spectrum. As a result, green emissions from the second doped semiconductor nanophosphor would not re-excite that phosphor and would not substantially excite the other semiconductor nanophosphors if mixed together. Stated another way, the green phosphor emissions would be subject to little or no phosphor re-absorption, even in mixtures containing the other doped semiconductor nanophosphors. As shown, however, the green phosphor provides a relatively broad radiation spectrum, as might appear as a pastel green to a human observer.

The third line of the graph shows the emission spectrum for an orange emitting doped semiconductor nanophosphor. Although not shown, the absorption spectrum for this third phosphor also includes the 380-420 nm near UV range and extends down into the UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this phosphor has a broad peak in the wavelength region humans perceive as orange, e.g. centered around a wavelength in a range of say 600-610 nm in the illustrated example. Again, the emission spectrum of the phosphor is well above the illustrated absorption spectra of the other doped semiconductor nanophosphors and well above its own absorption spectrum. The absorption spectrum at or below 460 nm would be below the emission spectrum of the other three phosphors, except possibly for some small overlap with the blue emission spectrum. As a result, orange emissions from the third doped semiconductor nanophosphor would not substantially re-excite that phosphor and would not substantially excite the other semiconductor nanophosphors if mixed together. Stated another way, the orange phosphor emissions also should be subject to little or no phosphor re-absorption, even in mixtures containing the other semiconductor nanophosphors. As shown, however, the orange phosphor provides a relatively broad radiation spectrum, as might appear as a pastel orange to a human observer.

For example, to increase the emissions of the lamp at the higher wavelength range of the 210 nm wide portion of the visible spectrum, the mixture used further includes a red emitting phosphor. Although doped semiconductor nanophosphors could be used, this example, assumes that the red phosphor is a cadmium based semiconductor nanophosphor (non-doped). Although not shown, the absorption spectrum for this fourth phosphor also includes the 380-420 nm near UV range. Depending on the phosphor used, the absorption spectrum may extend down into the UV range or may extend somewhat up into the blue range. In the later case, the red phosphor may be somewhat subject to more re-absorption of and excitation in response to emissions from the other phosphors, than was the case for the doped semiconductor nanophosphors. The emission spectrum of this fourth phosphor has a broad peak in the wavelength region humans perceive as red, e.g. centered approximately around 650 nm in the example.

Doped semiconductor nanophosphors exhibit a large Stokes shift, that is to say from a short-wavelength range of absorbed energy up to a fairly well separated longer-wavelength range of emitted light. FIG. 7B shows the absorption and emission spectra of three examples of doped semiconductor nanophosphors. Each line of the graph also includes an approximation of the emission spectra of the 405 nm LED chip, to help illustrate the relationship of the 405 nm LED emissions to the absorption spectra of the exemplary doped semiconductor nanophosphors. The illustrated spectra are not drawn precisely to scale but in a manner to provide a teaching example to illuminate our discussion here.

The top line (a) of the graph shows the absorption and emission spectra for an orange emitting doped semiconductor nanophosphor. The absorption spectrum for this first phosphor includes the 380-420 nm near UV range, but that absorption spectrum drops substantially to 0 (has an upper limit) somewhere around or a bit below 450 nm. As noted, the phosphor exhibits a large Stokes shift from the short wavelength(s) of absorbed light to the longer wavelengths of re-emitted light. The emission spectrum of this first phosphor has a fairly broad peak in the wavelength region humans perceive as orange. Of note, the emission spectrum of this first phosphor is well above the illustrated absorption spectra of the other doped semiconductor nanophosphors and well above its own absorption spectrum. As a result, orange emissions from the first doped semiconductor nanophosphor would not re-excite that phosphor and would not excite the other doped semiconductor nanophosphors if mixed together. Stated another way, the orange phosphor emissions would be subject to little or no phosphor re-absorption, even in mixtures containing one or more of the other doped semiconductor nanophosphors.

The next line (b) of the graph in FIG. 7B shows the absorption and emission spectra for a green emitting doped semiconductor nanophosphor. The absorption spectrum for this second phosphor includes the 380-420 nm near UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this second phosphor has a broad peak in the wavelength region humans perceive as green. Again, the emission spectrum of the phosphor is well above the illustrated absorption spectra of the other doped semiconductor nanophosphors and well above its own absorption spectrum. As a result, green emissions from the second doped semiconductor nanophosphor would not re-excite that phosphor and would not excite the other doped semiconductor nanophosphors if mixed together. Stated another way, the green phosphor emissions also should be subject to little or no phosphor re-absorption, even in mixtures containing one or more of the other doped semiconductor nanophosphors.

The bottom line (c) of the graph in FIG. 7B shows the absorption and emission spectra for a blue emitting doped semiconductor nanophosphor. The absorption spectrum for this third phosphor includes the 380-420 nm near UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this third phosphor has a broad peak in the wavelength region humans perceive as blue. The main peak of the emission spectrum of the phosphor is well above the illustrated absorption spectra of the other doped semiconductor nanophosphors and well above its own absorption spectrum. In the case of the blue example, there is just a small amount of emissions in the region of the phosphor absorption spectra. As a result, blue emissions from the third doped semiconductor nanophosphor would re-excite that phosphor at most a minimal amount. As in the other phosphor examples of FIG. 7B, the blue phosphor emissions would be subject to relatively little phosphor re-absorption, even in mixtures containing one or more of the other doped semiconductor nanophosphors.

Examples of suitable orange, green and blue emitting doped semiconductor nanophosphors of the types generally described above relative to FIG. 7B are available from NNCrystal of Fayetteville, Ark.

As explained above, the large Stokes shift results in negligible re-absorption of the visible light emitted by doped semiconductor nanophosphors. This allows the stacking of multiple phosphors. It becomes practical to select and mix two, three or more such phosphors in a manner that produces a particular desired spectral characteristic in the combined light output generated by the phosphor emissions.

Figure 8A:
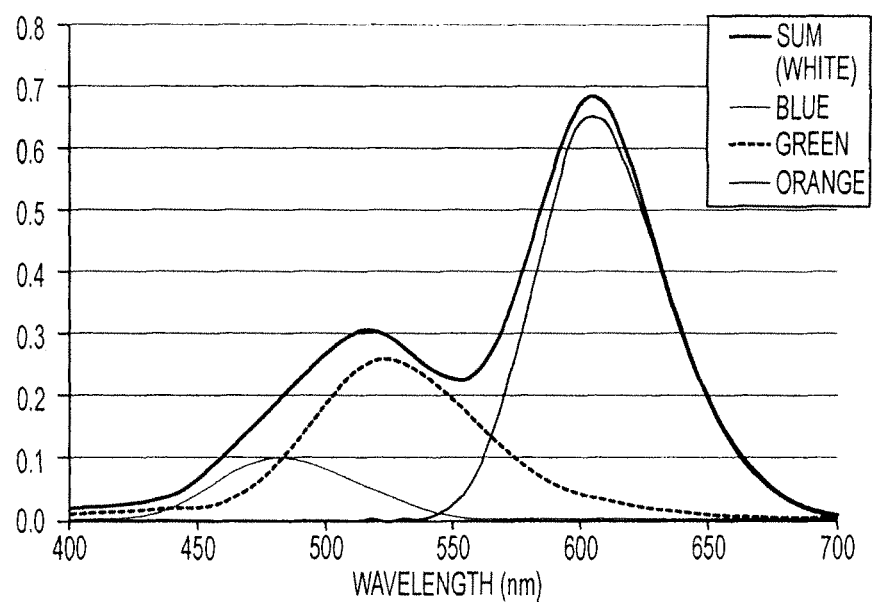
FIG. 8A is a graph of emission spectra of three of the doped semiconductor nanophosphors selected for use in an exemplary lamp as well as the spectrum of the white light produced by combining the spectral emissions from those three phosphors.

FIG. 8A graphically depicts emission spectra of three of the doped semiconductor nanophosphors selected for use in an exemplary lamp as well as the spectrum of the white light produced by summing or combining the spectral emissions from those three phosphors. For convenience, the emission spectrum of the LED has been omitted from FIG. 8A, on the assumption that a high percentage of the 405 nm light from the LED is absorbed by the phosphors. Although the actual output emissions from the fixture may include some near UV light from the LED, the contribution thereof if any to the sum in the output spectrum should be relatively small.

Although other combinations are possible based on the nanophosphors discussed above relative to FIGS. 7A-7B or based on other semiconductor nanophosphor materials, the example of FIG. 8A represents emissions of blue, orange and green phosphors. The emission spectra of the blue, orange and green emitting doped semiconductor nanophosphors are similar to those of the corresponding color emissions shown in FIG. 7B. Light is additive. Where the lamp includes the blue, orange and green emitting doped semiconductor nanophosphors, the addition of the blue, orange and green emissions produces a combined spectrum as approximated by the top or 'Sum' curve in the graph of FIG. 8A.

Various mixtures of doped semiconductor nanophosphors will produce white light emissions from a lamp that exhibit CRI of 75 or higher. For an intended lamp specification, a particular mixture of phosphors is chosen so that the light output of the fixture exhibits color temperature in one of the following specific ranges along the black body curve: 2,725±145° Kelvin; 3,045±175° Kelvin; 3,465±245° Kelvin; 3,985±275° Kelvin; 4503±243° Kelvin; 5028±283° Kelvin; 5665±355° Kelvin; and 6530±510° Kelvin. In the example shown in FIG. 8A, the 'Sum' curve in the graph produced by the mixture of blue, green and orange emitting doped semiconductor nanophosphors would result in a white light output having a color temperature of 2800° Kelvin (within the 2,725±145° Kelvin range). That white output light also would have a CRI of 80 (higher than 75).

It is possible to add one or more additional nanophosphors, e.g. a fourth, fifth, etc., to the mixture to further improve the CRI. For example, to improve the CRI of the nanophosphor mix of FIGS. 7B and 8A, a doped semiconductor nanophosphor might be added to the mix with a broad emissions spectrum that is yellowish-green or greenish-yellow, that is to say with a peak of the phosphor emissions somewhere in the range of 540-570 nm, say at 555 nm.

Figure 8B:
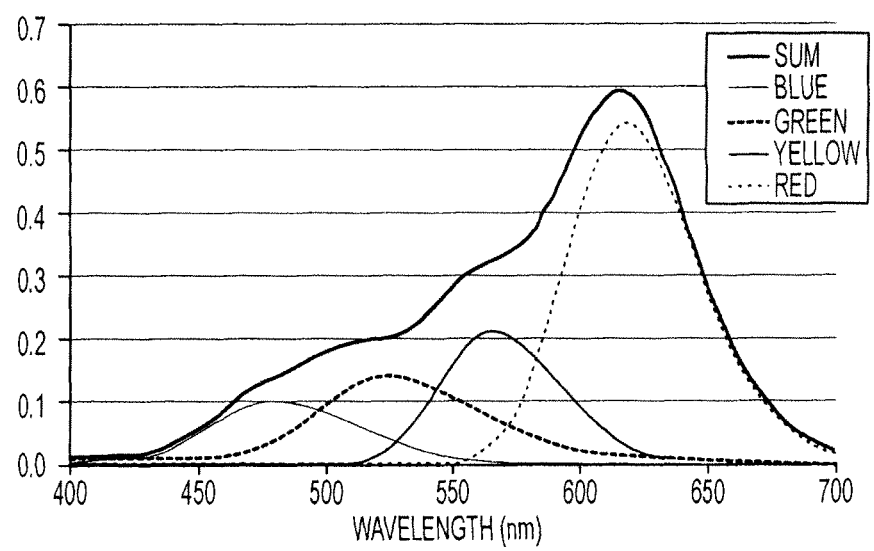
FIG. 8B is a graph of emission spectra of four doped semiconductor nanophosphors, in this case, for red, green, blue and yellow emissions, as well as the spectrum of the white light produced by combining the spectral emissions from those four phosphors.

Other mixtures also are possible, with two, three or more doped semiconductor nanophosphors. The example of FIG. 8B uses red, green and blue emitting semiconductor nanophosphors, as well as a yellow fourth doped semiconductor nanophosphor. Although not shown, the absorption spectra would be similar to those of the three nanophosphors discussed above relative to FIG. 7B. For example, each absorption spectrum would include at least a portion of the 380-420 nm range. All four phosphors would exhibit a large Stokes shift from the short wavelength(s) of absorbed light to the longer wavelengths of re-emitted light, and thus their emissions spectra have little or no overlap with the absorption spectra.

In this example (FIG. 8B), the blue nanophosphor exhibits an emission peak at or around 484, nm, the green nanophosphor exhibits an emission peak at or around 516 nm, the yellow nanophosphor exhibits an emission peak at or around 580, and the red nanophosphor exhibits an emission peak at or around 610 nm. The addition of these blue, green, red and yellow phosphor emissions produces a combined spectrum as approximated by the top or 'Sum' curve in the graph of FIG. 8B. The 'Sum' curve in the graph represents a resultant white light output having a color temperature of 2600° Kelvin (within the 2,725±145° Kelvin range), where that white output light also would have a CRI of 88 (higher than 75).

As shown by the examples of FIGS. 7B-8B, the emission spectra of the various exemplary nanophosphors are substantially broader than the relatively monochromatic emission spectra of the LEDs. As shown by the graphs in FIGS. 8A and 8B, the emission spectra of some of the nanophosphors overlap, although the emissions peaks are separate. Such spectra represent pastel colors of relatively low purity levels. However, when added together, these emission spectra tend to fill-in gaps somewhat, so that there may be peaks but not individual spikes in the spectrum of the resultant combined output light. Stated another way, the visible output light tends to be at least substantially white of a high quality when observed by a person. Although not precisely white in the electromagnetic sense, the light formed by combining or summing the emissions from the phosphors may approach a spectrum corresponding to that of a black body. Of the two examples, the 'sum' curve for the white light in the example of FIG. 8B comes closer to the spectrum of light corresponding to a point on the black body curve over a wavelength range from about 425 nm to about 630 nm, although the peak in the example somewhat exceeds the black body spectrum and the exemplary sum spectrum falls off somewhat faster after that peak.

In several examples offering particular high spectral white light quality, the visible light output of the lamp deviates no more than ±50% from a black body radiation spectrum for the rated color temperature for the device, over at least 210 nm of the visible light spectrum. Also, the visible light output of the device has an average absolute value of deviation of no more than 15% from the black body radiation spectrum for the rated color temperature for the device, over at least the 210 nm of the visible light spectrum.

With any of these doped semiconductor nanophosphor strategies using emitters rated to emit energy of wavelengths from the blue/green region around 460 nm down into the UV range below 380 nm, the implementations can use different nanophosphor/phosphor combinations/mixtures deployed via different instances of the inner member 34 to produce lamps with white light output at different color temperatures at the specified high spectral quality.

Variation in the proportions or percentages of different phosphors with respect to the total amount of phosphors in a mix adapts a particular lamp design to output different color temperatures of white light.

As discussed later, an appropriate mixture of the phosphors for a selected one of the color temperatures will also result in lamp outputs within certain tolerance metrics with respect to the 210 nm wide section of the black body radiation spectrum for the particular nominal color temperature. Using spectral data for the relevant phosphor materials, corresponding to the respective spectra shown in FIG. 7A, approximate percentage mixtures were developed as would be expected to produce outputs of the color characteristics at the specified nominal color temperatures. Table 6 below shows relative percentages of the four phosphors (blue, green and orange doped semiconductor nanophosphors; and a red semiconductor nanophosphor) that may be used in exemplary lamps, where the spectral data for the phosphors show that the combinations should produce a device output having the rated or nominal color temperature. The colors of the phosphors represent the general appearance of the color emitted by each phosphor. As outlined above, however, these phosphors provide relatively broad emission spectra and may appear somewhat pastel in color (rather than more pure or saturated hues). For each phosphor, the percentage is the proportional amount of that phosphor with respect to the total amount of phosphors in the mixture (combination of all four phosphors in the example). As discussed more later, these percentage mixtures of the phosphors also cause lamps using such mixtures to produce light that approaches or approximates the black body radiation spectrum for the rated color temperatures.

TABLE 6

Percentages of Phosphors in Mixtures for Selected Color Temperature Ranges

| Nominal CCT | % Blue | % Green | % Orange | % Red |
|---|---|---|---|---|
| 2700 | 10 | 21 | 25 | 45 |
| 3000 | 14 | 21 | 22 | 43 |
| 3500 | 17 | 25 | 27 | 30 |
| 4000 | 21 | 29 | 24 | 26 |
| 4500 | 28 | 27 | 22 | 22 |
| 5000 | 32 | 26 | 21 | 21 |
| 5700 | 37 | 23 | 19 | 21 |
| 6500 | 43 | 21 | 17 | 19 |

For convenience, each of the percentages in the table has been rounded to the nearest whole number.

A lamp that has a material bearing one of the mixtures of Table 6 is expected to produce a white light output of a color temperature corresponding to the listed nominal color temperature, that is to say within the corresponding color temperature range of Table 3 and within the corresponding chromaticity quadrangle of Tables 4 and 5. The combination of phosphors, however, is expected to also produce a white light that has a high quality spectral content, that is to say that approaches or corresponds to the black body radiation spectrum for the rated color temperature, over the 210 nm portion of the spectrum (e.g. from 450 nm to 660 nm). The percentages listed in Table 6 are given by way of example. Those skilled in the art will appreciate that even for the same four phosphors, some variation in the proportions/percentages of the different phosphors should produce similarly acceptable color/spectral performance in the light output of the lamp. Also, different phosphors will have different characteristic emission spectra and therefore would be mixed in different proportions.

Based on the emissions spectra data for the four selected phosphors, as represented by the spectral graphs of FIG. 7A, and assuming relative percentages of the four phosphors as listed in Table 6, simulations/data analyses were done to determine the expected performance and to compare performance to the black body radiation spectra for the different nominal color temperatures. FIGS. 12-20 show graphs of various results of the simulations with respect to the phosphors/mixtures for the eight different color temperatures considered as examples herein.

The simulation data is normalized, so that the black body radiation spectrum and the radiation spectrum of the lamp both represent the same overall intensity of light output, to facilitate comparative analysis. For example, for a lamp designed for an output at one of the rated color temperatures and a given output intensity, e.g. designed for a specified or rated number of lumens output, the black body radiation spectrum data for the rated color temperature is adjusted to represent the same output intensity.

Assume that the remotely deployed phosphors in the lamp include the blue, green and orange emitting doped semiconductor nanophosphors and the red phosphor as discussed above relative to 12A to 12C.

With reference to Table 6, the mixture would contain 10% of the Blue doped semiconductor nanophosphor, 21% of the Green doped semiconductor nanophosphor, 25% of the Orange doped semiconductor nanophosphor and 45% of the Red semiconductor nanophosphor. As discussed earlier, the exemplary semiconductor LED chip formed by layers 13b and 15b (FIG. 3B) is rated to emit near UV electromagnetic energy of a wavelength in the range of ≦460 nm, such as 405 nm in the illustrated example, which is within the excitation or absorption spectrum of each of the phosphors in the mixture. When excited, that combination of phosphors re-emits the various wavelengths of visible light represented by the blue, green, orange, red lines in the graph of FIG. 7A. However, the relative amount of each respective phosphor emission spectrum included in the device output spectrum corresponds to the percentage of the respective phosphor in the mixture. Since each phosphor is fully excited and emits a proportional amount of light corresponding to the percentage thereof in the phosphor mixture, the combination or addition of the four phosphor emission spectrum in the lamp output produces "white" light, which for purposes of our discussion herein is light that is at least substantially white light. The white light emission from the lamp exhibits a radiation spectrum corresponding to the wavy line in the example of FIG. 12A. Also, the light output of the white light lamp exhibits color temperature of 2738° Kelvin that is within the 2,725±145° Kelvin range for the nominal 2700° K color temperature.

Figure 12A:
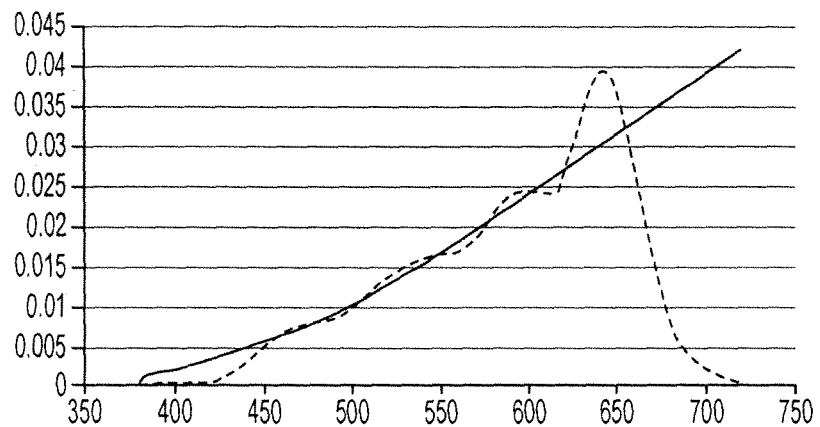
FIGS. 12A to 12C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 2700° Kelvin example.

FIG. 12A also shows the black body radiation spectrum for the rated color temperature 2700° Kelvin. The black body radiation spectrum has been normalized in that it is adjusted to represent a light intensity the same as the intensity of the light output of the white light lamp. As shown, the radiation spectrum of the light output of the device tracks somewhat the black body radiation spectrum for the rated color temperature 2700° Kelvin, particularly over the 450 to 660 nm range, although there is some deviation between the black body radiation spectrum and the device output spectrum.

Figure 12B:
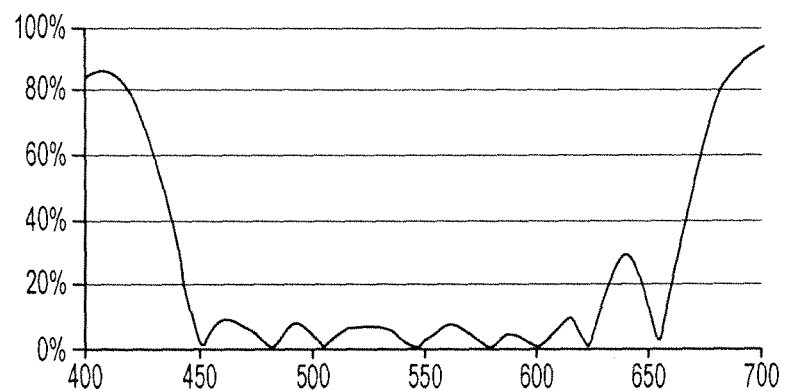
Figure 12C:
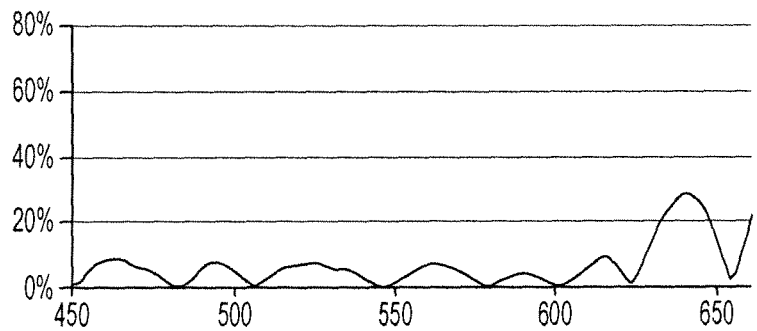
Figure 13A:
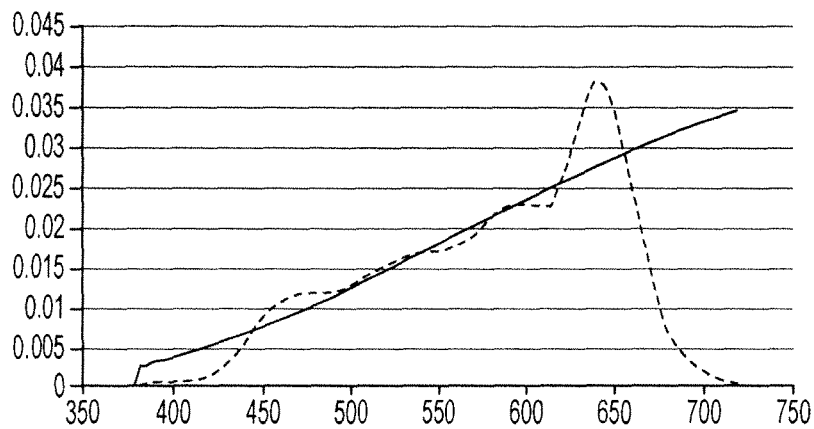
FIGS. 13A to 13C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 3000° Kelvin example.
Figure 13B:
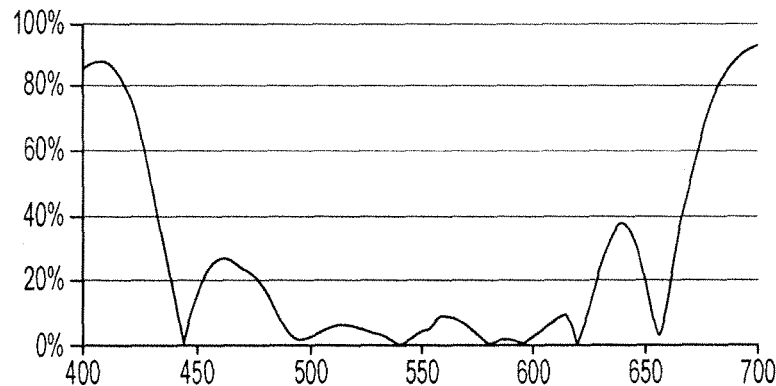
Figure 13C:
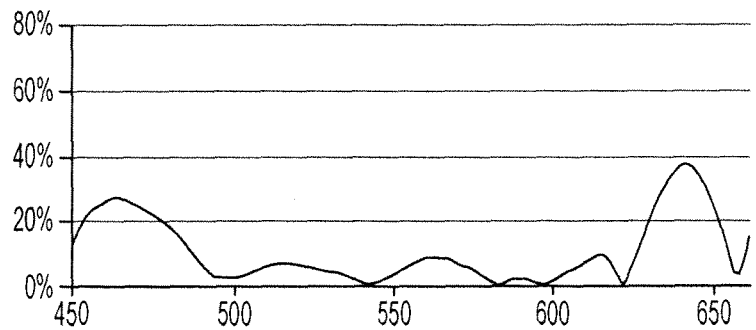
Figure 14A:
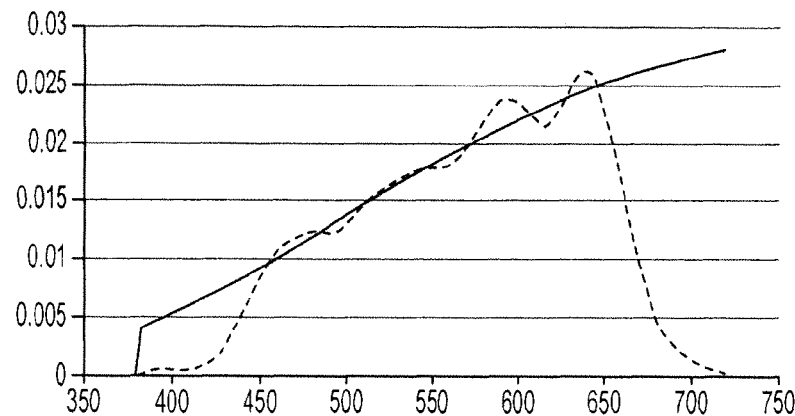
FIGS. 14A to 14C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 3500° Kelvin example.
Figure 14B:
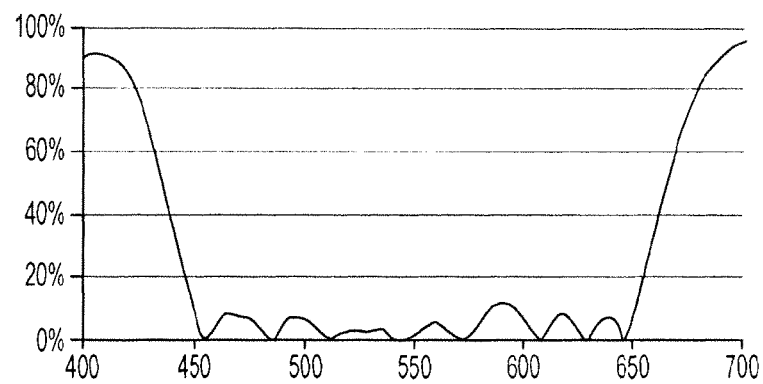
Figure 14C:
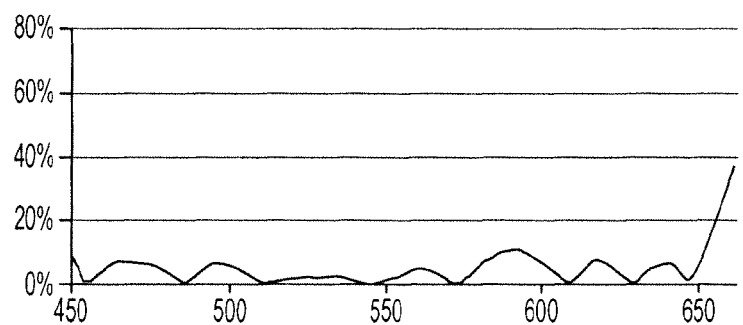
Figure 15A:
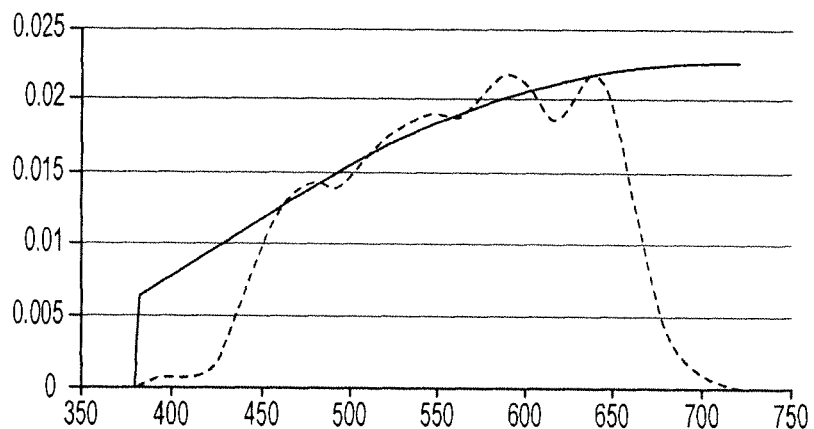
FIGS. 15A to 15C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 4000° Kelvin example.
Figure 15B:
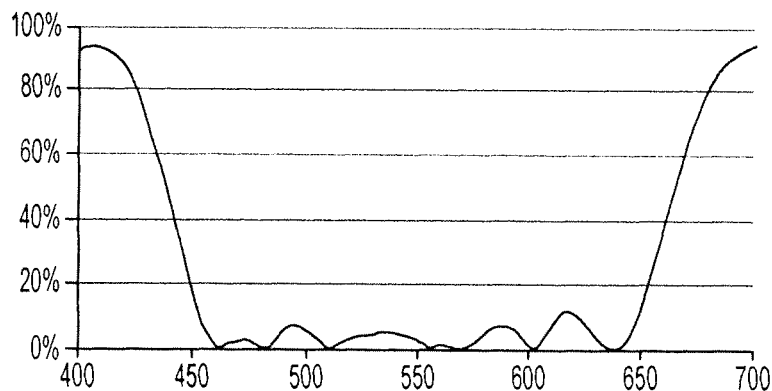
Figure 15C:
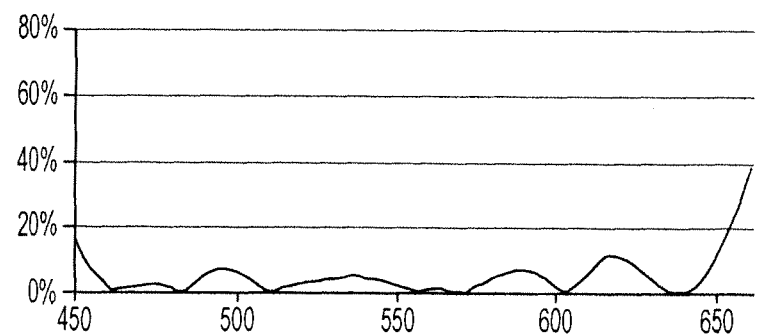
Figure 16A:
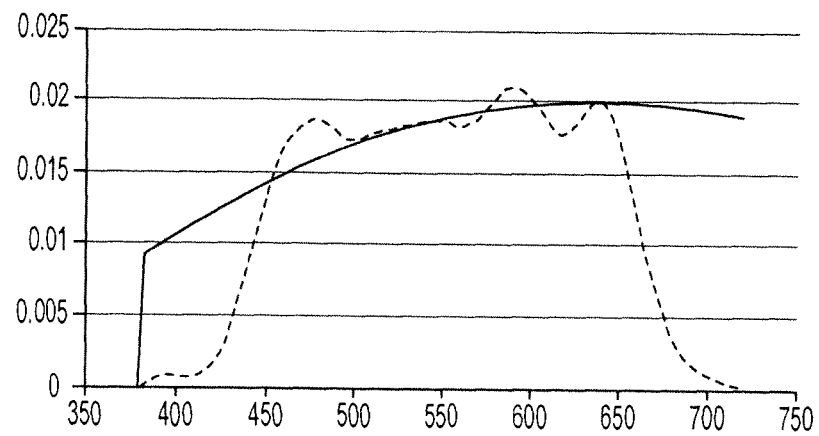
FIGS. 16A to 16C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 4500° Kelvin example.
Figure 16B:
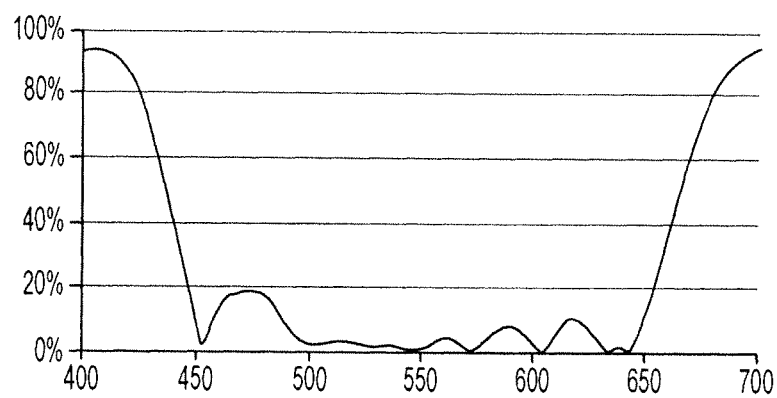
Figure 16C:
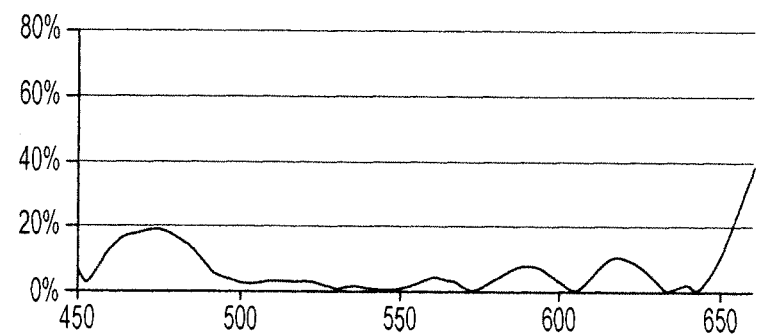
Figure 17A:
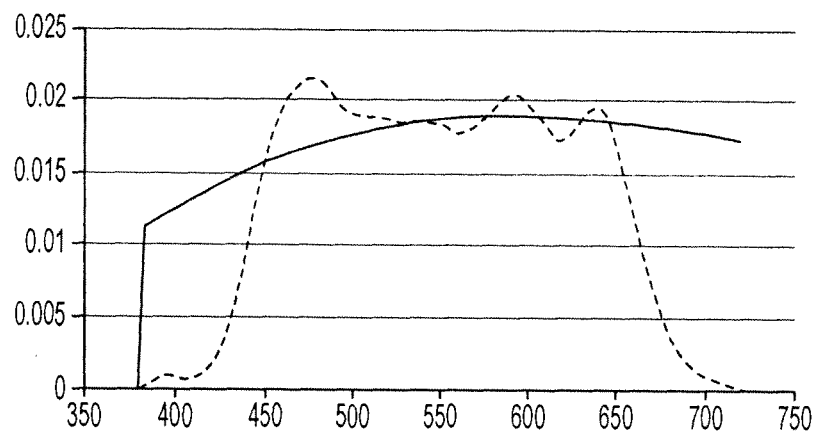
FIGS. 17A to 17C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 5000° Kelvin example.
Figure 17B:
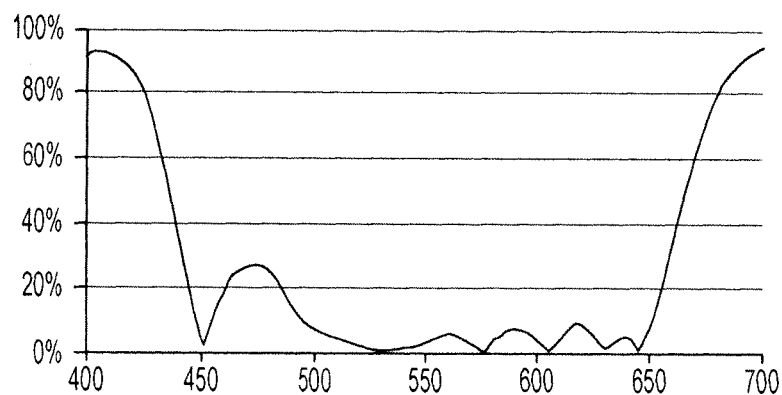
Figure 17C:
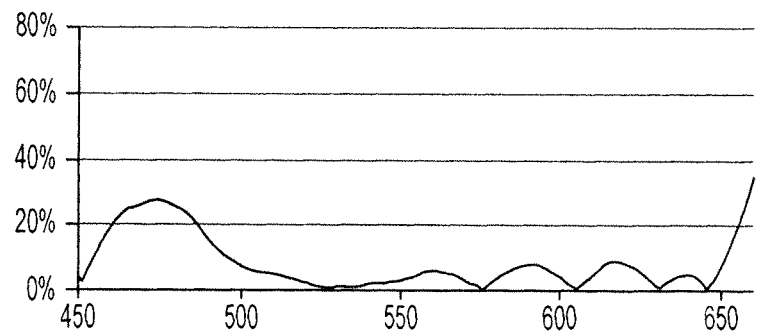
Figure 18A:
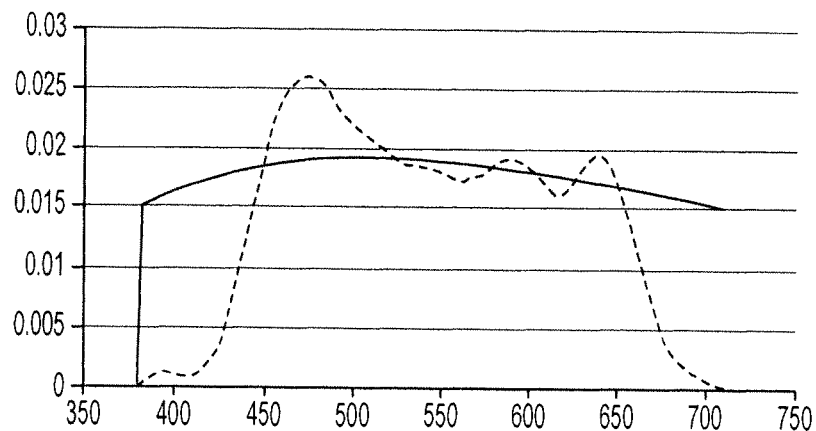
FIGS. 18A to 18C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 5700° Kelvin example.
Figure 18B:
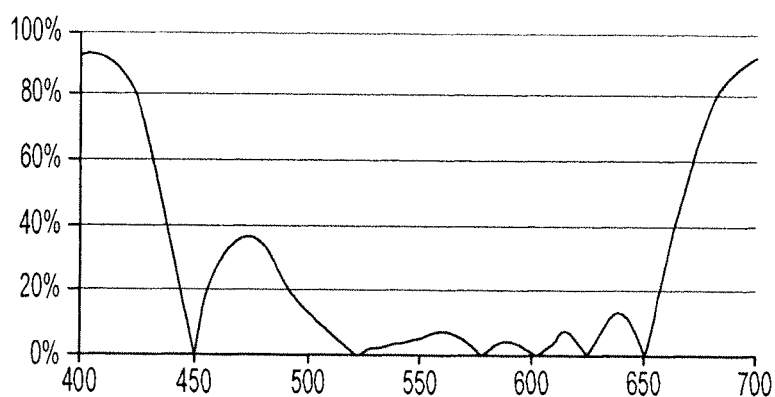
Figure 18C:
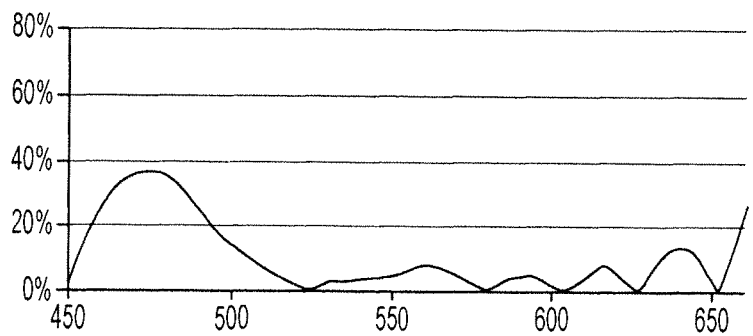

FIGS. 12B and 12C show deviation between the black body radiation spectrum and the spectrum of the white light lamp, albeit over different portions or ranges of the visible light spectrum. These drawings show the percentage of the absolute value of the deviation (absolute value of the difference between the lamp output spectrum and the normalized black body radiation spectrum, as a percent of the normalized black body radiation spectrum). FIG. 12B shows the deviation over the full range of the output radiation spectrum of the device, 400 to 700 nm in the example. However, as discussed earlier, the region of particular interest for approximation of the black body radiation spectrum is a 210 nm range, such as the 450 to 660 nm range. Hence, FIG. 12C shows the deviation over 450 to 660 nm range.

The graphs/data may be statistically analyzed and compared in a number of ways to appreciate spectral performance. Although other statistical measures of the degree to which the simulated lamp output spectrum approaches or approximates the relevant portion of the black body radiation spectrum for the rated color temperature, we have used deviation between the two spectra and various metrics related to the deviation.

In the example of FIGS. 12A to 12C, for the example configured for a nominal or rated CIE color temperature (CCT) of 2700, the average of the absolute value of the deviation of the lamp spectrum from the black body radiation spectrum was 7%, over the 450-660 nm range. Over that same range, the maximum absolute value of the deviation of the lamp spectrum from the black body radiation spectrum was 29%. As shown by the graph in FIG. 12C, this occurred at the peak in deviation around the wavelength 640 nm, which corresponds to the spectral peak of the lamp output shown in FIG. 12A. From a CRI analysis of the spectral data for the 2700° Kelvin example, it was also determined that the output light of such a lamp should exhibit a CRI at or about 98.

The same simulations and analyses using the phosphor percentages (Table 6) for the other rated color temperatures were performed. FIGS. 13 to 19 are similar to FIG. 12, except that FIGS. 13 to 19 show the corresponding graphs for the other nominal color temperatures discussed herein.

Table 7 below shows the various statistical measures of the difference or deviation between the lamp output radiation spectrum and the black body radiation spectrum, for the eight nominal color temperatures represented by the graphs in FIGS. 12-19. The exemplary simulation data and thus the deviation values and averages in the table are based on data points or values for the black body and lamp radiation spectra for every other nm wavelength (every 2 nm) over the relevant spectral range. However, since the metrics use maximum absolute value deviation and an average, it is believed that analyses based on different numbers/widths of spectral data points (e.g. every nm, every 5 nm, every 10 nm, etc.) would produce similar results.

TABLE 7

Deviation (Δ) Metrics for Lamps Rated at Nominal Color Temperatures

| Nominal CCT | Avg. \|Δ %\| Over 450-660 nm | Max. \|Δ %\| Over 450-660 nm |
|---|---|---|
| 2700 | 7 | 29 |
| 3000 | 11 | 38 |
| 3500 | 5 | 34 |
| 4000 | 5 | 37 |
| 4500 | 6 | 36 |
| 5000 | 8 | 33 |
| 5700 | 11 | 37 |
| 6500 | 14 | 48 |

Approximation of the black body radiation spectrum is intended to produce a high quality spectral content. As noted earlier, although other measures may be used or developed, the current standard metric of spectral content for lighting applications is CRI. Hence, the CRI for each example also was calculated from the spectral data. Table 8 below lists specific expected color temperature and CRI values for the lamp using the above discussed phosphor mixtures to produce white light outputs of the rated color temperatures.

TABLE 8

Color Temperatures and CRI Results for Lamps Rated at Nominal Color Temperatures

| Nominal CCT (° Kelvin) | Output Color Temp. (° Kelvin) | Device Output CRI |
|---|---|---|
| 2700 | 2738 | 98 |
| 3000 | 3050 | 94 |
| 3500 | 3461 | 93 |
| 4000 | 3997 | 90 |
| 4500 | 4547 | 91 |
| 5000 | 4936 | 90 |
| 5700 | 5679 | 90 |
| 6500 | 6759 | 86 |

An actual phosphor mixture was prepared using the four phosphors for a 2700° Kelvin output. The percentages were approximately 11% of the Blue, 23% of the Green, and 27% of the Orange, for the doped semiconductor nanophosphors; and 38% of the red semiconductor nanophosphor. The mixture produced a light output CCT of 2839° Kelvin (within the 2725±145° Kelvin range).

Figure 19A:
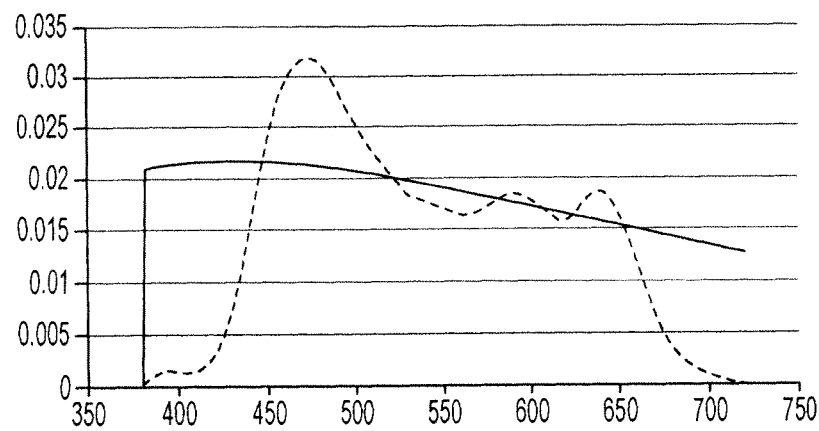
FIGS. 19A to 19C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for a 6500° Kelvin example.
Figure 19B:
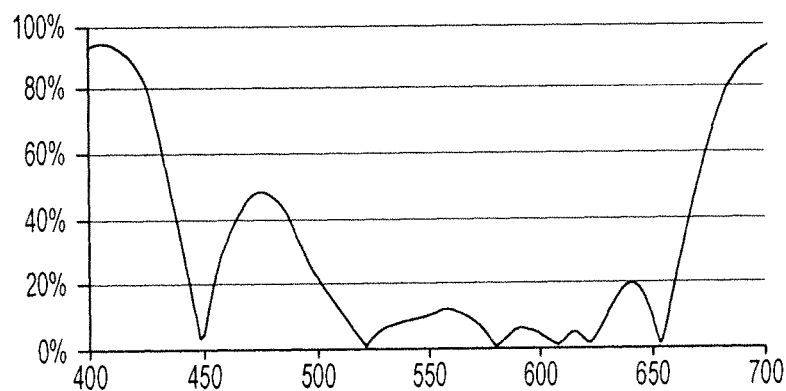
Figure 19C:
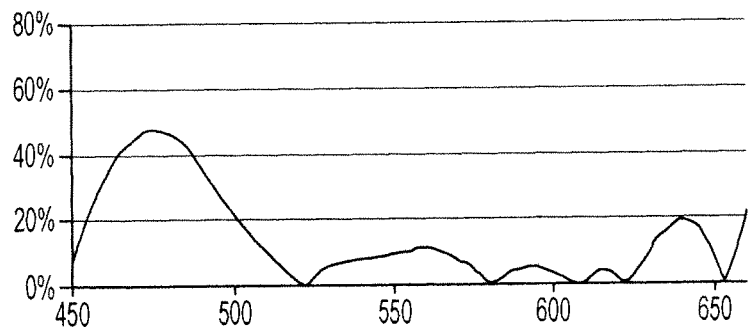
Figure 20A:
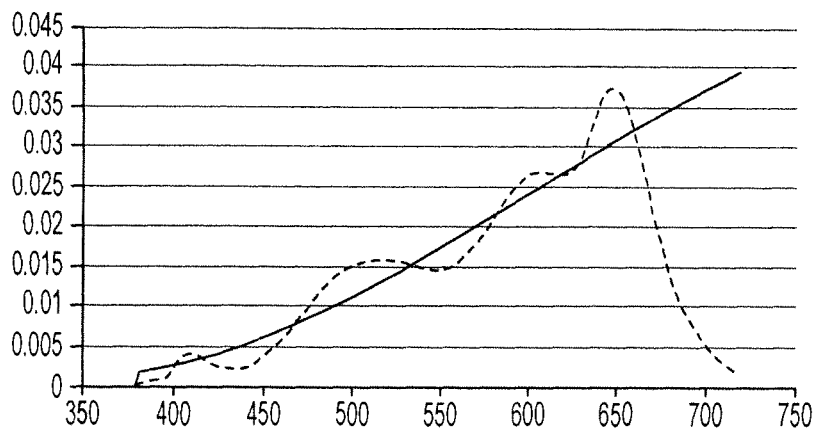
FIGS. 20A to 20C respectively are a spectral chart of the black body radiation spectrum and a device output radiation spectrum, a graph of absolute value of deviation as a percentage between the two spectra over a broad range, and a graph of absolute value of deviation as a percentage between the two spectra over the specific 210 nm range, for an actual phosphor mixture rated for 2700° Kelvin output.
Figure 20B:
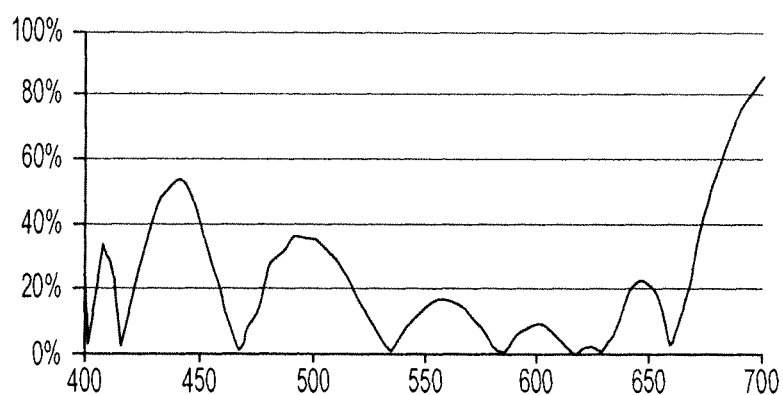
Figure 20C:
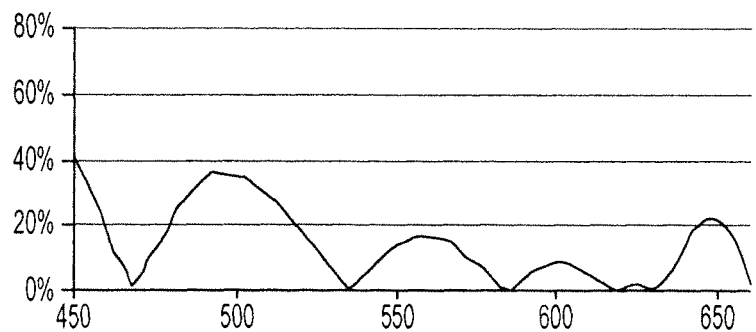

FIGS. 20A to 20C are spectral and deviation graphs for the 2700° Kelvin phosphor mixture similar to the simulation graphs of FIGS. 19A to 19C. The lamp radiation spectrum (wavy line) in FIG. 20A is that for the actual phosphor mixture. The black body radiation spectrum in FIG. 20A is that for 2700° Kelvin, the same as in FIG. 19A. Again, the black body radiation spectrum has been normalized in that it is adjusted to represent a light intensity the same as the intensity of the light output of the lamp, in this case, the output for the actual phosphor mixture. As shown, the radiation spectrum of the light output of the lamp tracks somewhat the black body radiation spectrum for the rated color temperature 2700° Kelvin, particularly over the 450 to 660 nm range, although there is some deviation between the black body radiation spectrum and the device output spectrum.

FIGS. 20B and 20C show deviation between the black body radiation spectrum and the spectrum of the actual phosphor mixture, albeit over different portions or ranges of the visible light spectrum. These drawings show the percentage of the absolute value of the deviation (absolute value of the difference between the device output spectrum and the normalized black body radiation spectrum, as a percent of the normalized black body radiation spectrum). FIG. 20B shows the deviation over the full range of the output radiation spectrum of the lamp, 400 to 700 nm in the example. However, as discussed earlier, the region of particular interest for approximation of the black body radiation spectrum is a 210 nm range, such as the 450 to 660 nm range. Hence, FIG. 20C shows the deviation over 450 to 660 nm range.

Over the 210 nm range from 450 nm to 660 nm, the average of the absolute value of deviation of the lamp output radiation spectrum from the black body radiation spectrum for 2700° Kelvin was 15%. Over that range, the maximum deviation between the output radiation spectrum and the corresponding black body radiation spectrum was 42%. Also, the light output of the actual phosphor mixture exhibited a CRI of 91.

From the simulation and the test data, the inventors propose that a high quality spectral content produced by a lamp, using phosphors in the manner and/or exemplary percentages described would exhibit (i) a maximum absolute value of the deviation of the device spectrum from the black body radiation spectrum of no more than 50% (deviates no more than ±50%) from a black body radiation spectrum for the rated color temperature for the lamp over at least 210 nm of the visible light spectrum; and (ii) would have an average absolute value of deviation of no more than 15% from the black body radiation spectrum for the rated color temperature for the lamp over at least the 210 nm of the visible light spectrum.

However, from the data, it should be apparent that some lamps may be able to meet even stricter performance standards, although perhaps not at all of the exemplary rated color temperatures.

Hence, using the simulation results from Tables 7 and 8 for the color temperature range of 2700-5700° Kelvin to define the outer boundaries of acceptable spectral performance, which is slightly larger than that achieved by 5700° Kelvin but does not encompass the outliner example at 6500° Kelvin, another set of spectral requirements would be for the lamp output spectrum to exhibit (i) absolute value of deviation of no more than 42% from a black body radiation spectrum for the rated color temperature for the lamp (deviates no more than ±42%) over at least 210 nm of the visible light spectrum and (ii) would have an average absolute value of deviation of no more than 12% from the black body radiation spectrum for the rated color temperature for the lamp over at least the 210 nm of the visible light spectrum. Such a lamp output would provide a CRI of 87 or better.

Using the actual simulation results from Tables 7 and 8 for the color temperature range of 2700-5700° Kelvin to define the outer boundaries of acceptable spectral performance, another set of spectral requirements would be for the lamp output spectrum to exhibit (i) a maximum absolute deviation of no more than 37% (deviates no more than ±37%) from a black body radiation spectrum for the rated color temperature for the device over at least 210 nm of the visible light spectrum; and (ii) would have an average absolute value of deviation of no more than 11% from the black body radiation spectrum for the rated color temperature for the lamp over at least the 210 nm of the visible light spectrum. Such a lamp output would provide a CRI of 90 or better.

In Table 7, the best 5 average deviations (Avg. |Δ%|) were for 2700 (7), 3500 (5), 40000 (5), 4500, (6) and 5000 (8). The examples give an average range for the averages of 5-8%. For these same color temperatures the largest maximum absolute value of deviation was 37% (at 4000). Hence, using that more limited best of five results for the average, from Table 7, another set of spectral requirements would be for the device output spectrum to exhibit (i) maximum absolute value of deviation of no more than 37% (deviates no more than ±37%) from a black body radiation spectrum for the rated color temperature for the device over at least 210 nm of the visible light spectrum; but (ii) would have an average absolute value of deviation of no more than 8% from the black body radiation spectrum for the rated color temperature for the device over at least the 210 nm of the visible light spectrum. From those same best five data points, the data in Table 6 shows that the a device output would provide a CRI of 90 or better.

The drawings and the discussion above have specifically addressed only a small number of examples of lamps that may utilize the remote phosphor technique to produce high spectral quality white light. Those skilled in the art will appreciate that the technology is readily adaptable to a wide range of lighting devices, systems and/or device components.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A lamp, comprising:
a plurality of solid state light emitters;
a bulb;
a pedestal comprising first and second sections, the first section extending into an interior of the bulb supporting the solid state light emitters, at least some of the solid state light emitters being supported on the pedestal in orientations such that principal directions of light emissions from respective emitters are radial outward from the pedestal through the bulb in a plurality of different radial directions, and at least one of the solid state emitters being supported on an end of the first section of the pedestal in such an orientation so that a principal direction of emission of light from the at least one solid state light emitter is substantially the same as or parallel with a longitudinal axis of the lamp;
an inner member, of a material that is at least partially light transmissive, radially and longitudinally around the solid state light emitters between an inner surface of the bulb and the solid state light emitters and at distances from the inner surface of the bulb and the solid state emitters;
a phosphor, remotely deployed in the lamp with respect to the solid state light emitters, the phosphor being of a type for converting at least some portion of light from the solid state light emitters from a first spectral characteristic to a second spectral characteristic, to produce an output of the lamp from the bulb that is at least substantially white;
a heat sink;
a lighting industry standard lamp base for providing electricity from a lamp socket; and
circuitry connected to receive electricity from the lamp base, for driving the solid state emitters to emit light, wherein:
the inner member remotely deploys the phosphor with respect to the solid state light emitters, and
the second section of the pedestal comprises a spiral-shaped heat pipe connected to and extending from the first section into the heat sink and forming a spiral in heat communicative contact with the heat sink.

2. The lamp of claim 1, wherein the material of the inner member is gas permeable.

3. The lamp of claim 1, wherein:
the phosphor is coated on an inner or outer surface of the inner member.

4. The lamp of claim 1, wherein:
the phosphor is impregnated in the material of the inner member, and
the material is non-gas permeable.

5. The lamp of claim 1, wherein:
the material of the inner member is a permeable light transmissive mesh.

6. The lamp of claim 1, wherein:
the inner member forms at least one wall of a gas-tight container enclosing the phosphor; and
the gas-tight container is filled with a gas that is at least substantially oxygen free.

7. The lamp of claim 1, wherein:
the pedestal includes a multi-surfaced three-dimensional core, and
distinct lateral surfaces of the multi-surfaced core face outward from a longitudinal axis of the lamp and support the at least some of the solid state light emitters in different radial principal emission orientations.

8. The lamp of claim 7, wherein one of the solid state emitters is supported on a distinct end surface of the multi-surfaced three-dimensional core.

9. The lamp of claim 1, wherein:
the solid state light emitters are emitters for emitting light that is at least substantially white at a first color temperature; and
the phosphor is of a type for converting at least some portion of the white light from the solid state light emitters from the first spectral characteristic to the second spectral characteristic to produce the white light output from the bulb at a second color temperature.

10. The lamp of claim 9, wherein the phosphor comprises at least one semiconductor nanophosphor.

11. The lamp of claim 10, wherein the light output from the lamp via the bulb, produced by a combination of some light from the solid state emitters and excitation of the semiconductor nanophosphors, has a color rendering index (CRI) of 75 or higher.

12. The lamp of claim 10, wherein the light output from the lamp via the bulb, produced by a combination of some light from the solid state emitters and excitation of the at least one semiconductor nanophosphor, exhibits a color temperature in one of the following ranges:
2,725±145° Kelvin;
3,045±175° Kelvin;
3,465±245° Kelvin; and
3,985±275° Kelvin.

13. The lamp of claim 12, wherein the solid state light emitters are emitters for emitting light that is at least substantially white at a color temperature greater than 4260° Kelvin.

14. The lamp of claim 13, wherein each of the solid state light emitters is rated with a principal wavelength of emission in a range of about 460 nm and below; and
the phosphor further comprises a rare earth phosphor.

15. The lamp of claim 14, wherein the substantially white light output from the lamp has a color temperature in one of the following ranges:
2,725±145° Kelvin;
3,045±175° Kelvin;
3,465±245° Kelvin;
3,985±275° Kelvin;
4503±243° Kelvin;
5028±283° Kelvin;
5665±355° Kelvin; and
6530±510° Kelvin.

16. The lamp of claim 1, wherein:
the phosphor comprises a plurality of doped semiconductor nanophosphors;
the plurality of solid state light emitters are emitters having a wavelength output in the near UV range of 380-460 nm; and
each semiconductor nanophosphor is of a type for converting at least some portion of the near UV wavelength range from the solid state emitter.

17. The lamp of claim 16, wherein:
(a) visible light output from the lamp produced upon excitation of the doped semiconductor nanophosphors by light from the solid state emitters is at least substantially white;
(b) the substantially white light output from the lamp has a color rendering index (CRI) of 75 or higher; and
(c) the substantially white light output from the lamp has a color temperature in one of the following ranges:
2,725±145° Kelvin;
3,045±175° Kelvin;
3,465±245° Kelvin;
3,985±275° Kelvin;
4503±243° Kelvin;
5028±283° Kelvin;
5665±355° Kelvin; and
6530±510° Kelvin.

18. The lamp of claim 17, wherein the substantially white light corresponds to a point on a black body radiation spectrum.

19. The lamp of claim 1, further comprising:
a lighting industry standard lamp base for providing electricity from a lamp socket; and
circuitry connected to receive electricity from the lamp base, for driving the solid state emitters of the source to emit the light and to excite the remotely deployed phosphor.

20. The lamp of claim 1, further comprising:
a circuit board attached to the thermal core for driving the solid state light emitters, wherein:
the circuit board extends vertically upward from the lamp base in an interior space within the heat sink, and
the spiral shaped second section of the heat pipe coils around a portion of the circuit board.

21. The lamp of claim 1, wherein the heat sink comprises:
an interior surface and longitudinally arranged heat radiation fins extending outward from the interior surface, each heat radiation fin having a section extending radially outward, wherein:
the spiral shaped second section of the heat pipe is in heat communicative contact with the interior surface of the heat sink,
the heat sink supports the heat pipe within the lamp, and
the heat generated by the solid state emitters is transferred from the spiral shaped second section of the heat pipe and the interior surface of the heat sink to the longitudinally arranged heat radiation fins.

22. The lamp of claim 21, wherein:
the first section of the pedestal comprises a first end forming a hot interface for receiving heat generated by the solid state emitters,
the second section of the heat pipe comprises a second end for receiving the heat from the first end of the first section of the heat pipe, and
the heat is transferred out of a cold interface at the second end of the second section of the heat pipe to the interior surface of the heat sink.

23. The lamp of claim 1, wherein the first section of the pedestal extends along an axis of the lamp substantially centered through the spiral of the second section of the heat pipe.

24. A lamp, comprising:
a solid state light emitter;
a bulb;
a pedestal comprising first and second sections, the first section extending into an interior of the bulb supporting the solid state light emitter, the solid state light emitter being supported on the first section of the pedestal in an orientation such that principal direction of light emissions from the emitter is outward from the pedestal through the bulb;
an inner member, of a material that is at least partially light transmissive, radially and longitudinally around the solid state light emitter between an inner surface of the bulb and the solid state light emitter and at a distance from the inner surface of the bulb and the solid state emitter;
a phosphor, remotely deployed in the lamp with respect to the solid state light emitter, the phosphor being of a type for converting at least some portion of light from the solid state light emitter from a first spectral characteristic to a second spectral characteristic, to produce an output of the lamp from the bulb that is at least substantially white;

a heat sink;

a lighting industry standard lamp base for providing electricity from a lamp socket; and circuitry connected to receive electricity from the lamp base, for driving the solid state emitters to emit light, wherein:

the inner member remotely deploys the phosphor with respect to the solid state light emitter, and the second section of the pedestal comprises a spiral-shaped heat pipe connected to and extending from the first section into the heat sink and forming a spiral in heat communicative contact with the heat sink.

25. The lamp of claim 24, wherein:

the light output from the lamp via the bulb, produced by a combination of some light from the solid state emitter and excitation of the phosphor, has a color rendering index (CRI) of 75 or higher, and exhibits a color temperature in one of the following ranges:

2,725±145° Kelvin;
3,045±175° Kelvin;
3,465±245° Kelvin; and
3,985±275° Kelvin.

26. The lamp of claim 24, further comprising:

a circuit board attached to the thermal core for driving the solid state light emitters, wherein:

the circuit board extends vertically upward from the lamp base in an interior space within the heat sink, and the spiral shaped second section of the heat pipe coils around a portion of the circuit board.

27. The lamp of claim 24, wherein the heat sink comprises:

an interior surface and longitudinally arranged heat radiation fins extending outward from the interior surface, each heat radiation fin having a section extending radially outward, wherein:

the spiral shaped second section of the heat pipe is in heat communicative contact with the interior surface of the heat sink, the heat sink supports the heat pipe within the lamp, and the heat generated by the solid state emitters is transferred from the spiral shaped second section of the heat pipe and the interior surface of the heat sink to the longitudinally arranged heat radiation fins.

28. The lamp of claim 27, wherein:

the first section of the pedestal comprises a first end forming a hot interface for receiving heat generated by the solid state emitters, the second section of the heat pipe comprises a second end for receiving the heat from the first end of the first section of the heat pipe, and the heat is transferred out of a cold interface at the second end of the second section of the heat pipe to the interior surface of the heat sink.

29. The lamp of claim 24, wherein the first section of the pedestal extends along an axis of the lamp substantially centered through the spiral of the second section of the heat pipe.

* * * * *